United States Patent
Li et al.

(10) Patent No.: US 9,113,570 B2
(45) Date of Patent: Aug. 18, 2015

(54) PLANAR ELECTRONIC DEVICE HAVING A MAGNETIC COMPONENT

(71) Applicant: TYCO ELECTRONICS SERVICES GMBH, Schaffhausen (CH)

(72) Inventors: Haiying Li, Elk Grove, CA (US); Sidharth Dalmia, Fair Oaks, CA (US); Mark McGrath, West Sacramento, CA (US)

(73) Assignee: Tyco Electronics Services GmbH, Schaffhausen (CH)

( * ) Notice: Subject to any disclaimer, the term of this patent is extended or adjusted under 35 U.S.C. 154(b) by 227 days.

(21) Appl. No.: 13/665,517

(22) Filed: Oct. 31, 2012

(65) Prior Publication Data

US 2014/0116758 A1    May 1, 2014

(51) Int. Cl.
*H05K 1/16* (2006.01)
*H01F 17/06* (2006.01)

(52) U.S. Cl.
CPC .............. *H05K 1/165* (2013.01); *H01F 17/062* (2013.01); *H05K 2201/086* (2013.01); *H05K 2201/09036* (2013.01); *H05K 2203/1178* (2013.01)

(58) Field of Classification Search
USPC ................ 174/260, 256; 137/322, 525, 635; 205/775; 257/686; 324/444; 385/14; 435/287.2; 506/39
See application file for complete search history.

(56) References Cited

U.S. PATENT DOCUMENTS

| | | | |
|---|---|---|---|
| 4,003,968 A * | 1/1977 | Rickert ............................ 261/35 |
| 4,086,934 A * | 5/1978 | Bagwell et al. ................ 137/322 |
| 4,112,450 A * | 9/1978 | Kondo .......................... 396/467 |
| 4,212,610 A * | 7/1980 | Weidlich et al. .............. 425/110 |
| 4,904,879 A * | 2/1990 | Rudy et al. ....................... 307/17 |
| 5,207,737 A * | 5/1993 | Hanley et al. .................... 137/85 |
| 5,226,634 A * | 7/1993 | Rudy et al. ..................... 267/181 |
| 5,959,846 A * | 9/1999 | Noguchi et al. ............... 361/782 |
| 6,033,764 A * | 3/2000 | Balents et al. ................. 428/209 |
| 6,083,460 A * | 7/2000 | Morikawa et al. ............. 422/404 |
| 6,453,096 B1 * | 9/2002 | Kim et al. ......................... 385/52 |
| 7,422,723 B1 * | 9/2008 | Betsill ............................. 422/84 |
| 7,512,432 B2 * | 3/2009 | Zocchi .......................... 600/347 |
| 7,780,057 B2 * | 8/2010 | Kishi et al. ...................... 228/37 |
| 8,137,462 B2 * | 3/2012 | Fondurulia et al. ........... 118/715 |
| 8,230,859 B1 * | 7/2012 | Voege et al. ............. 128/204.26 |
| 8,257,258 B2 * | 9/2012 | Zocchi .......................... 600/365 |
| 2003/0161572 A1 * | 8/2003 | Johnck et al. ................... 385/14 |
| 2004/0154923 A1 * | 8/2004 | Marquant et al. ............. 204/600 |
| 2004/0189311 A1 * | 9/2004 | Glezer et al. .................. 324/444 |
| 2004/0190259 A1 * | 9/2004 | Labanok et al. .............. 361/704 |
| 2005/0056974 A1 * | 3/2005 | Suzuki et al. ................. 264/605 |
| 2005/0123447 A1 * | 6/2005 | Koike et al. .................. 422/68.1 |
| 2005/0212123 A1 * | 9/2005 | Labanok et al. .............. 257/712 |
| 2006/0054351 A1 * | 3/2006 | Tornqvist et al. ............. 174/256 |
| 2006/0187139 A1 * | 8/2006 | Takakura ....................... 343/900 |
| 2007/0190785 A1 * | 8/2007 | Dando .......................... 438/689 |
| 2007/0295715 A1 * | 12/2007 | Saka et al. ..................... 219/624 |
| 2008/0157330 A1 * | 7/2008 | Kroehnert et al. ............. 257/686 |
| 2008/0247910 A1 * | 10/2008 | Weekamp et al. ......... 422/82.05 |
| 2009/0065357 A1 * | 3/2009 | Glezer et al. ............. 204/403.15 |
| 2009/0066339 A1 * | 3/2009 | Glezer et al. .................. 324/444 |
| 2009/0166398 A1 * | 7/2009 | Kishi et al. .................... 228/203 |

(Continued)

*Primary Examiner* — Xiaoliang Chen

(57) ABSTRACT

A planar electronic device includes a dielectric substrate having a recess. A functional electrical component is disposed within the recess of the substrate. A vent opening extends within the substrate such that the vent opening intersects the recess within a thickness of the substrate. The vent opening is open to atmosphere such that the vent opening fluidly connects the recess to the atmosphere.

13 Claims, 17 Drawing Sheets

(56) References Cited

U.S. PATENT DOCUMENTS

| | | | |
|---|---|---|---|
| 2009/0315320 A1* | 12/2009 | Finn | 283/107 |
| 2011/0001385 A1* | 1/2011 | Saito | 310/214 |
| 2011/0108317 A1* | 5/2011 | Harrison et al. | 174/266 |
| 2011/0201099 A1* | 8/2011 | Anderson et al. | 435/287.2 |
| 2011/0220656 A1* | 9/2011 | Gau | 220/500 |
| 2012/0037250 A1* | 2/2012 | Berner et al. | 137/625 |
| 2012/0055013 A1* | 3/2012 | Finn | 29/600 |
| 2012/0055809 A1* | 3/2012 | Glezer et al. | 205/775 |
| 2012/0190589 A1* | 7/2012 | Anderson et al. | 506/39 |
| 2012/0205653 A1* | 8/2012 | Nishikage et al. | 257/49 |
| 2013/0273775 A1* | 10/2013 | Chien | 439/620.01 |
| 2014/0070101 A1* | 3/2014 | Matsushima et al. | 250/338.5 |
| 2014/0093643 A1* | 4/2014 | Li | 427/238 |
| 2014/0111190 A1* | 4/2014 | Ryochi et al. | 324/127 |
| 2014/0182725 A1* | 7/2014 | Maichl et al. | 137/635 |

* cited by examiner

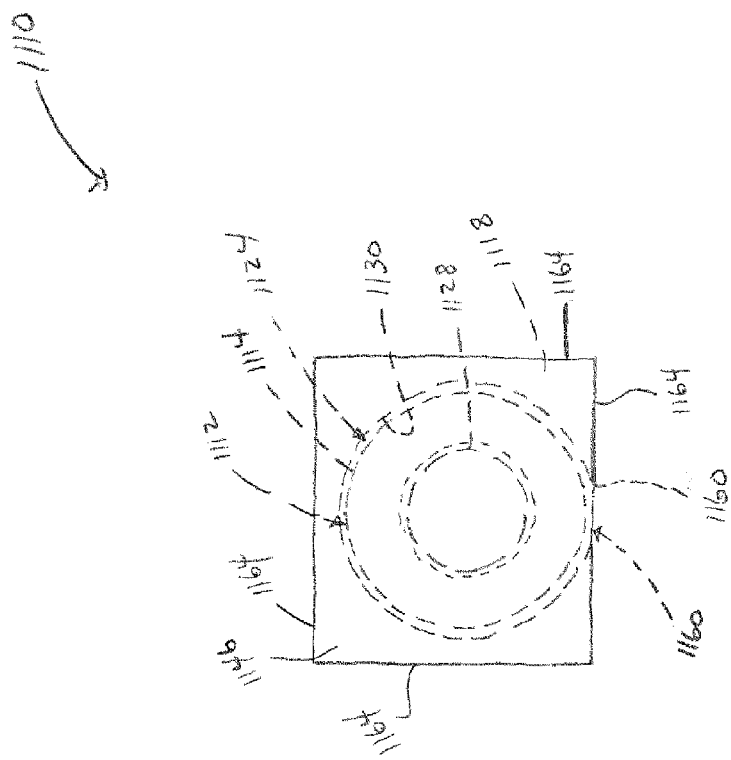

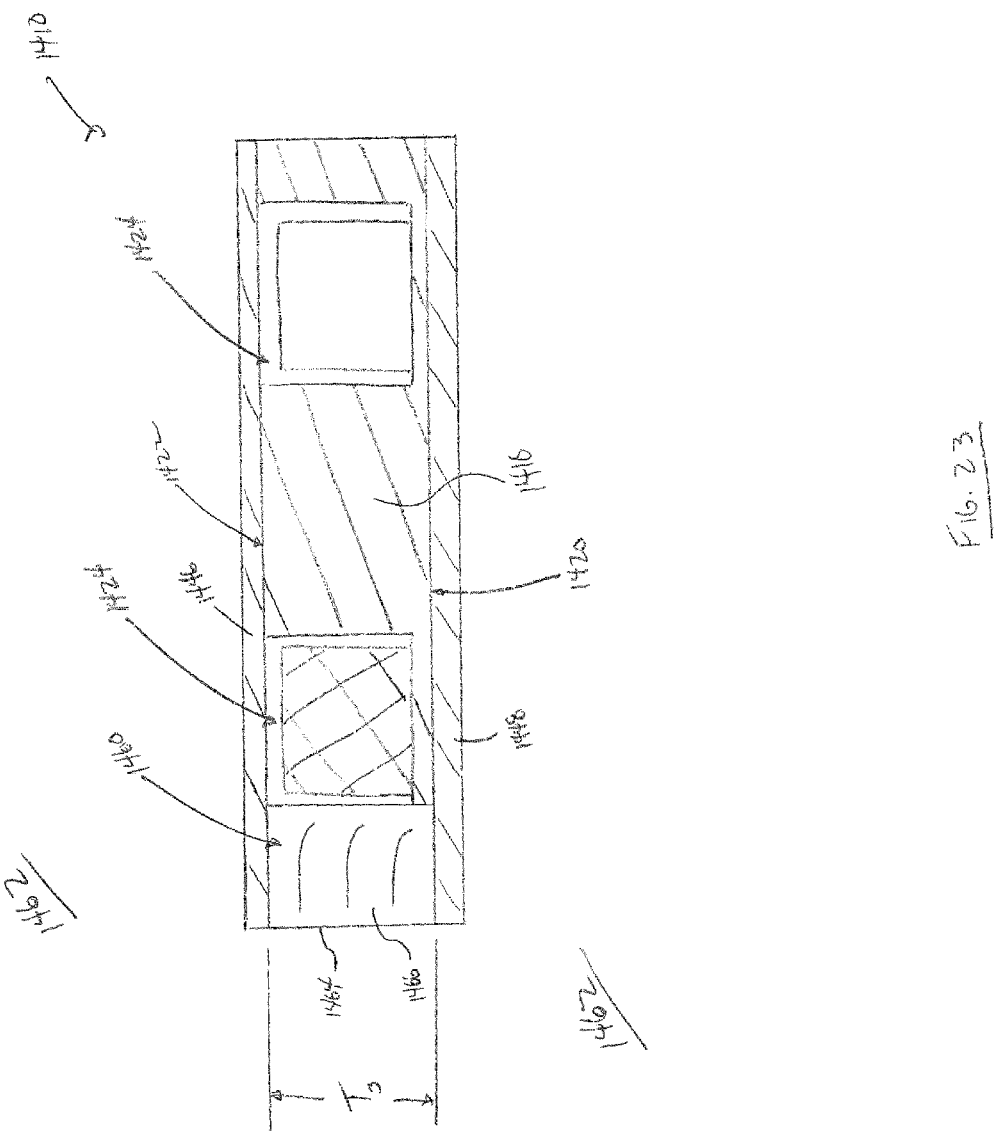

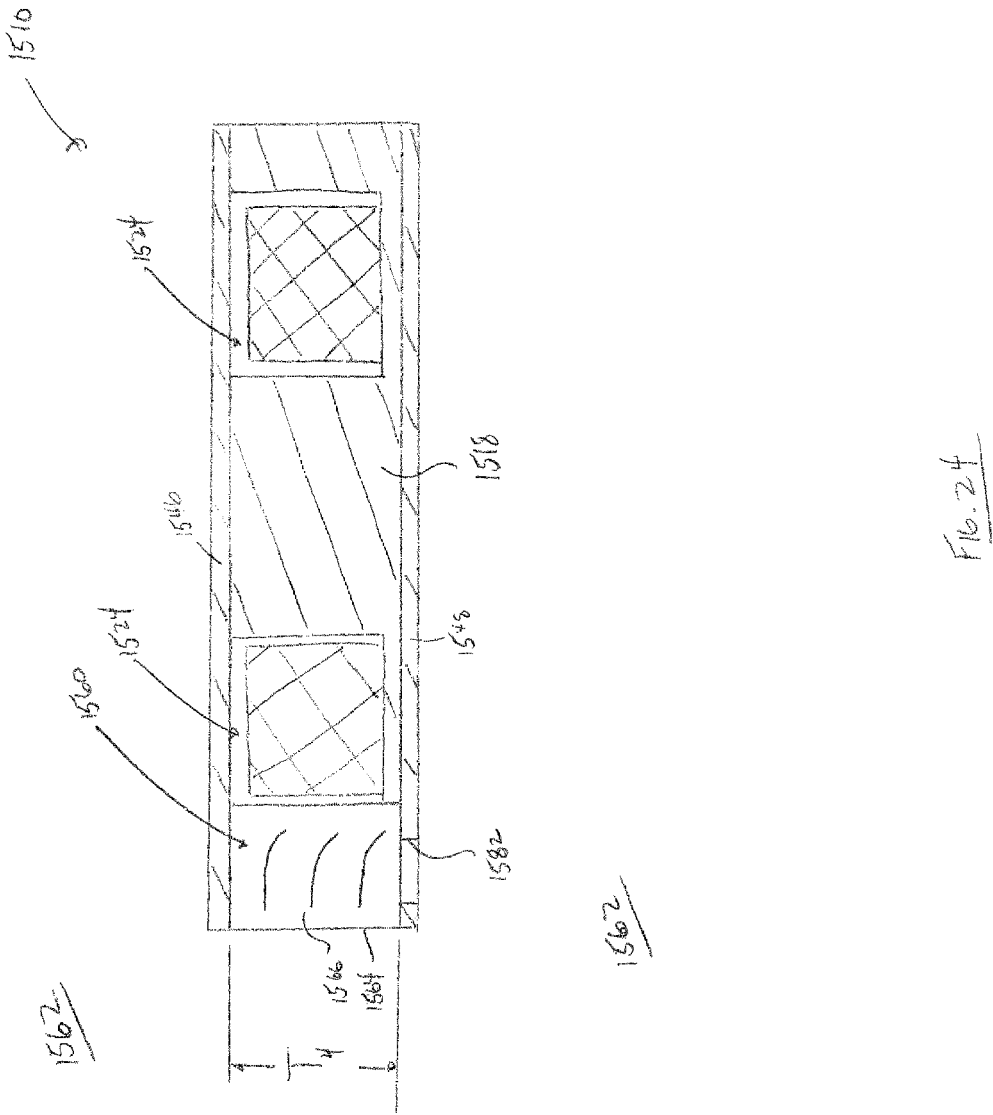

PLANAR ELECTRONIC DEVICE HAVING A MAGNETIC COMPONENT

BACKGROUND OF THE INVENTION

The subject matter herein relates generally to electronic devices, such as, but not limited to, transformers, inductors, filters, baluns, couplers, diplexers, multiplexers, modules, chokes, and/or the like.

Some known electronic devices include planar bodies, such as circuit boards, that include a magnetic component built into the planar body. The magnetic component may include a magnetic body (e.g., a ferrite core) that is disposed within a recess of the planar body. One or more conductive coils extend around the magnetic body to form the magnetic component. Examples of such a magnetic component include, but are not limited to, transformers, inductors, filters, baluns, couplers, diplexers, multiplexers, modules, chokes, and/or the like.

During fabrication of some known planar electronic devices, air, moisture, and/or other fluids can become trapped within the recess that holds the magnetic body of the magnetic component. The trapped air, moisture, and/or other fluids may damage the planar electronic device. For example, trapped air may expand within the recess when subjected to elevated temperatures during a subsequent fabrication step (e.g., a solder reflow step) and/or when the planar electronic device is subjected to environmental (i.e., ambient) temperature changes. Expansion of the air may break, fracture, and/or otherwise damage one or more components and/or layers of the planar electronic device. Moreover, and for example, moisture and/or other fluids that remain trapped within the recess that holds the magnetic body may corrode the magnetic body. Such damage caused by the expanded air, moisture, and/or other fluids may degrade operation of the planar electronic device and/or cause the planar electronic device to fail.

SUMMARY OF THE INVENTION

In one embodiment, a planar electronic device includes a dielectric substrate having a recess. A functional electrical component is disposed at least partially within the recess of the substrate. A vent opening extends within the substrate such that the vent opening intersects the recess within a thickness of the substrate. The vent opening is open to atmosphere such that the vent opening fluidly connects the recess to the atmosphere.

In another embodiment, a planar electronic device includes a dielectric substrate having a recess. A magnetic body is disposed within the recess of the substrate. Upper conductors are disposed above the substrate. Lower conductors are disposed below the substrate. Electrical vias extend through the substrate and conductively coupled with the upper conductors and the lower conductors such that the electrical vias, the upper conductors, and the lower conductors form at least one conductive coil that extends around the magnetic body. A vent opening extends within the substrate such that the vent opening is fluidly connected between the recess and atmosphere. The vent opening provides a pathway for fluid to flow from the recess to the atmosphere.

In another embodiment, a planar electronic device includes a dielectric substrate that extends a thickness from an upper side to a lower side that is opposite the upper side. The substrate includes a sidewall that extends between the upper and lower sides. The substrate has a recess that extends into the upper side. A functional electrical component is disposed at least partially within the recess of the substrate. A vent opening extends within the substrate such that the vent opening is fluidly connected between the recess and atmosphere. The vent opening provides a pathway for fluid to flow from the recess to the atmosphere. The vent opening extends through the sidewall and/or extends through a dielectric layer disposed above or below the substrate.

BRIEF DESCRIPTION OF THE DRAWINGS

FIG. 20 is top plan view of another exemplary embodiment of a planar electronic device.

FIG. 21 is top plan view of another exemplary embodiment of a planar electronic device.

FIG. 23 is a cross-sectional view of another exemplary embodiment of a planar electronic device.

FIG. 24 is a cross-sectional view of another exemplary embodiment of a planar electronic device.

DETAILED DESCRIPTION OF THE DRAWINGS

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

One or more embodiments described and/or illustrated herein provide planar electronic devices that include vent openings that extend within substrates of the electronic devices such that the vent openings intersect recesses that hold functional electrical components. The vent openings are open to atmosphere such that the vent openings fluidly connect the recesses to the atmosphere. The vent openings may extend through sidewalls of the substrates and/or through dielectric layers of the electronic device. At least one technical effect of various embodiments is preventing damage to a planar electronic device, for example by preventing undesired air burst and/or enabling air, moisture, and/or other fluids trapped within the recess to exhaust from the recess to the atmosphere. At least one other technical effect of various embodiments is planar electronic devices that are less costly and/or less labor intensive to fabricate.

Figure 1:
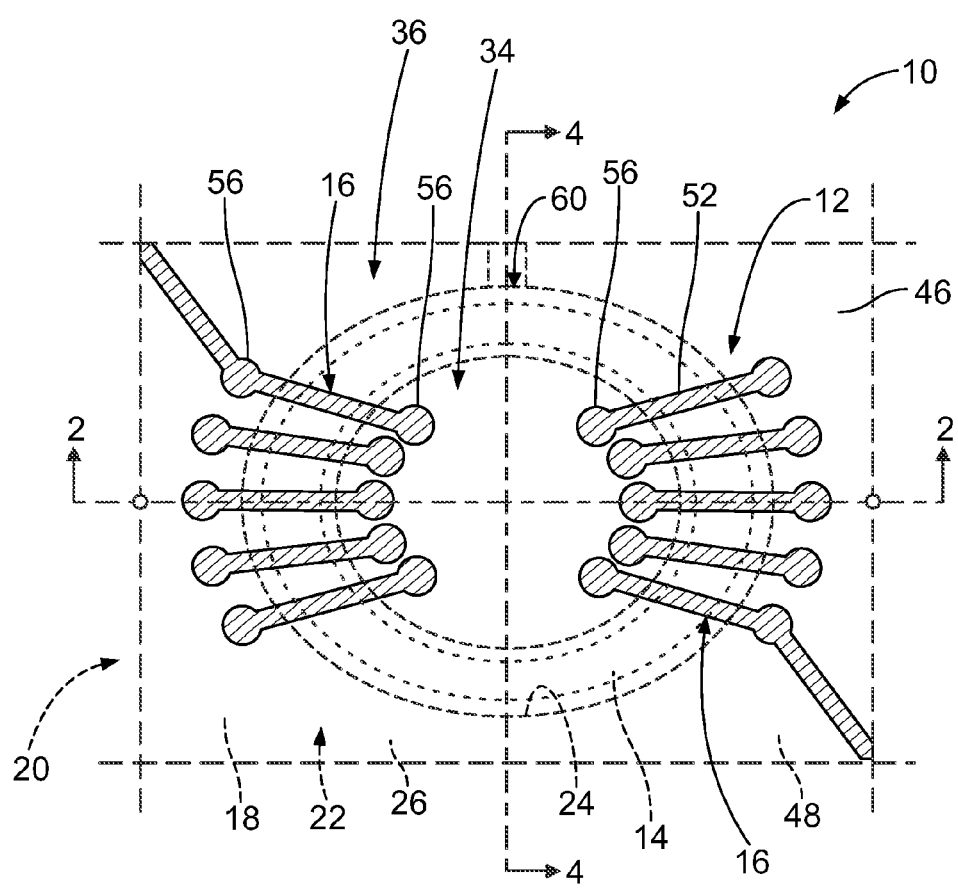
FIG. 1 is a top view of an exemplary embodiment of a planar electronic device.
Figure 2:
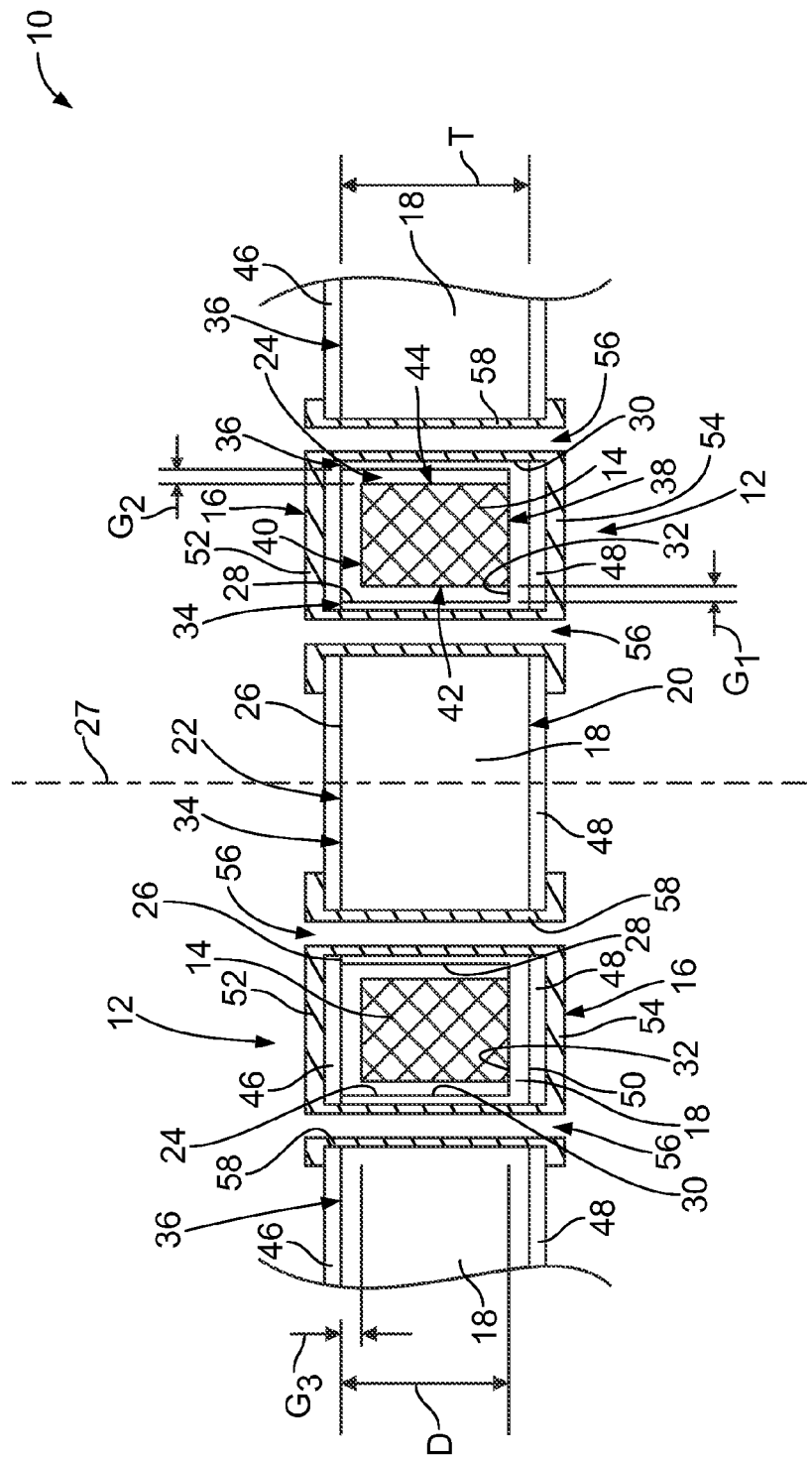
FIG. 2 is a cross-sectional view of the electronic device shown in FIG. 1 taken along line 2-2 of FIG. 1.

FIG. 1 is a top plan view of an exemplary embodiment of a planar electronic device 10. FIG. 2 is a cross-sectional view of the electronic device 10 taken along line 2-2 of FIG. 1. Referring now to FIGS. 1 and 2, the planar electronic device 10 includes a planar dielectric substrate 18 and one or more functional electrical components 12. At least a portion of the functional electrical component 12 is embedded within the substrate 18. In the exemplary embodiments, the functional electrical components described and illustrated herein are magnetic components that include magnetic bodies that are embedded within the substrate. For example, in the exemplary embodiment of the electronic device 10, the functional electrical component 12 is a magnetic component 12 that includes a magnetic body 14 and one or more conductive coils 16 that extend around the magnetic body 14. The magnetic body 14 is disposed within a recess 24 of the planar dielectric substrate 18 such that magnetic body 14 is embedded within the substrate 18. Although FIG. 2 shows only two electrically conductive layers (i.e., the upper conductors 52 and lower conductors 54 described below), it should be understood that multiple layers may be provided, for example using prepregs, adhesive sheets, adhesive films, and/or the like.

The magnetic component 12 may be any type of magnetic component that includes any type of magnetic body 14, such as, but not limited to, a transformer, an inductor, a filter, a balun, a coupler, a diplexer, a choke, a multiplexer, a module, and/or the like. But, the functional electrical components of the planar electronic devices and methods described and/or illustrated herein are not limited to magnetic components. Rather, the functional electrical component(s) of each of the electronic devices and methods described and/or illustrated herein may be any other type of functional electrical component, such as, but not limited to, non-magnetic inductors, capacitors, resistors, diodes, transistors transducers, switches, active electrical components, passive electrical components, and/or the like. In embodiments wherein a functional electrical component is a surface mount technology (SMT) component, electrical connections to terminals of the SMT component can be made using solder paste and/or the like that is applied through micro vias (e.g., from the lower side 20 described below).

As best seen in FIG. 2, the substrate 18 extends a thickness T (not visible in FIG. 1) from a lower side 20 to an opposite upper side 22 of the substrate 18. The substrate 18 includes and/or is formed from one or more dielectric materials, such as, but not limited to, a glass-filed epoxy (e.g., FR-4 and/or the like) suitable for a printed circuit board (PCB), a thermoset material, a thermoplastic material, another rigid or semi-rigid material, and/or the like. As used herein, the terms "lower" and "upper" are not meant to limit or require a single, specific orientation of the substrate 18. For example, the substrate 18 may be flipped over such that the upper side 22 is below the lower side 20.

The substrate 18 includes a recess 24 that extends into a surface of the substrate 18. The magnetic body 14 is disposed within the recess 24, as will be described below. In the exemplary embodiment, the recess 24 extends into a surface 26 of the substrate 18 that defines the upper side 22. But, the recess 24 may alternatively extend into the lower side 20 of the substrate 18. In still other embodiments, the recess 24 may extend completely through the thickness T of the substrate 18 including through both the sides 20 and 22. As best seen in FIG. 1, the recess 24 is shown as having a length that is a closed curve having the shape of an oval. But, the length of the recess 24 may have any other shape, such as, but not limited to, a circular shape, a rectangular shape, a square shape, a triangular shape, a multilateral shape, an irregular shape, a non-uniform shape, a non-symmetrical shape, and/or the like. Moreover, in some embodiments, the length of the recess 24 may not be closed (i.e., may be open).

Referring now solely to FIG. 2, the recess 24 extends a depth D into the substrate 18 along a central depth axis 27. Opposing sidewalls 28 and 30 of the recess 24 extend along the depth D of the recess 24 from the surface 26 of the upper side 22 to a bottom 32 of the recess 24. The depth D of the recess may have any value relative to the value of the thickness T of the substrate 18. The recess 24 is shown as having a rectangular cross-sectional shape. But, the recess 24 may have any other cross-sectional shape, such as, but not limited to, a partially-circular cross-sectional shape, a different rectangular cross-sectional shape, a square cross-sectional shape, a triangular cross-sectional shape, a multilateral cross-sectional shape, an irregular cross-sectional shape, a non-uniform cross-sectional shape, a non-symmetrical cross-sectional shape, a cross-sectional shape having a curved side, a partially oval cross-sectional shape, and/or the like. The cross-sectional shape of the recess 24 may have any number of sides. The size and/or shape of the recess 24 may be complementary with and/or based on the size and/or shape of the magnetic body 14.

Referring again to FIGS. 1 and 2, the recess 24 divides the upper side 22 of the substrate 18 into an interior segment 34 and a perimeter segment 36. The recess 24 extends around the interior segment 34. For example, in the exemplary embodiment, the interior segment 34 extends within the closed curve of the recess 24. The perimeter segment 36 extends around the recess 24. Accordingly, the recess 24 extends radially (relative to the central depth axis 27) between the interior segment 34 and the perimeter segment 36, as can be seen in FIGS. 1 and 2.

The magnetic body 14 is disposed within the recess 24 of the substrate 18. The magnetic body 14 is thereby disposed within the substrate 18. Referring again solely to FIG. 2, the magnetic body 14 rests on the bottom 32 of the recess 24. Alternatively, the magnetic body 14 may rest on another layer (e.g., the dielectric layer 48 described below) of the electronic device 10, for example in embodiments wherein the recess 24 extends completely through the thickness T of the substrate 18. In other words, in some alternative embodiments, the dielectric layer 48 defines the bottom 32 of the recess 24. The magnetic body 14 extends a height from a side 38 to an opposite side 40, and extends a width from a side 42 to an opposite side 44.

The magnetic body 14 may be any type of magnetic body, such as, but not limited to, a ferrite body, another type of magnetic body, and/or the like. Referring again to FIG. 1, the magnetic body 14 is shown as having a length that is a closed curve having the shape of an oval. But, the length of the magnetic body 14 may have any other shape, such as, but not limited to, a circular shape, a rectangular shape, and/or the like. Moreover, in some embodiments, the length of the magnetic body 14 may not be closed. Referring again to FIG. 2, magnetic body 14 is shown as having a rectangular cross-sectional shape. But, the magnetic body 14 may have any other cross-sectional shape, such as, but not limited to, a circular cross-sectional shape, a partially-circular cross-sectional shape, a different rectangular cross-sectional shape, a cross-sectional shape having a curved side, a partially oval cross-sectional shape, an oval cross-sectional shape and/or the like.

In the exemplary embodiment, a gap $G_1$ extends between the sidewall 28 of the recess 24 and the side 42 of the magnetic body 14, a gap $G_2$ extends between the sidewall 30 of the recess 24 and the side 44 of the magnetic body 14, and a gap $G_3$ extends between the side 40 of the magnetic body 14 and an optional dielectric layer 46 (described below) that is disposed above the substrate 18. The gaps $G_1$, $G_2$, and $G_3$ are filled with air. In some alternative embodiments, the electronic device 10 only includes one of the gaps $G_1$, $G_2$, and/or $G_3$, while in other alternative embodiments the electronic device 10 only includes two of the gaps $G_1$, $G_2$, and/or $G_3$.

The dielectric layer 46 is disposed above the upper side 22 of the substrate 18. In the exemplary embodiment, the dielectric layer 46 is disposed directly on the surface 26 of the upper side 22. In other embodiments, one or more other layers (e.g., an electrically conductive layer and/or another dielectric layer) may extend between the surface 26 of the upper side 22 and the dielectric layer 46. The electronic device 10 optionally includes the dielectric layer 48 disposed below the lower side 20 of the substrate 18. The dielectric layer 48 is disposed directly on a surface 50 of the lower side 20 in the exemplary embodiment. In other embodiments, one or more other layers (e.g., an electrically conductive layer and/or another dielectric layer) may extend between the surface 50 of the lower side 20 and the dielectric layer 48.

The dielectric layers 46 and 48 may include and/or be formed from any non-conductive materials, such as, but not limited to a polymer and/or the like. For example, the dielectric layers 46 and/or 48 may be formed by depositing an epoxy, a low stress epoxy, a thermoplastic, a high temperature thermoplastic, a high lateral flow ceramic filled hydrocarbon material, and/or the like. Moreover, and for example, for adhesion purposes the dielectric layers 46 and/or 48 may be an adhesive dielectric sheet and/or film, an organic adhesive sheet and/or film, and/or the like. The dielectric layers 46 and/or 48 may be cured to provide mechanical stability to the electronic device 10. For example, the dielectric layers 46 and/or 48 may be cured and become rigid bodies that laterally support the electronic device 10.

The magnetic component 12 includes upper conductors 52 disposed above the upper side 22 of the substrate 18, and lower conductors 54 (not visible in FIG. 1) disposed below the lower side 20 of the substrate 18. The upper conductors 52 are disposed directly on the dielectric layer 46 such that the dielectric layer 46 extends between the substrate 18 and the upper conductors 52. In the exemplary embodiment, the lower conductors 54 are disposed directly on the dielectric layer 48 such that the dielectric layer 48 extends between the substrate 18 and the lower conductors 54. In some alternative embodiments, the lower conductors 54 are disposed directly on the lower side 20 of the substrate 18 (e.g., in embodiments wherein the dielectric layer 48 is not included. As used herein, the terms "lower" and "upper" are not meant to limit or require a single, specific orientation of the substrate 18. For example, the substrate 18 may be flipped over such that the upper conductors 52 are below the upper side 22 of the substrate 18 and the lower conductors 54 are above the lower side 20 of the substrate 18.

The upper and lower conductors 52 and 54, respectively, may be disposed directly on the respective dielectric layers 46 and 48 by depositing conductive layers (e.g., metal and/or metal alloy layers) on the dielectric layers 46 and 48. In one embodiment, the conductors 52 and 54 are formed by selectively depositing copper and/or a copper alloy onto the respective dielectric layers 46 and 48. Additionally or alternatively, one or more other materials may be used. One or more additional conductive and/or metal layers can be added by laminating additional dielectric layers on, above, or below the conductors 52 and/or 54 and then depositing additional conductive layers (e.g., additional upper conductors 52 and/or additional lower conductors 54) on the additional dielectric layers.

Optionally, the lower conductors 54 are the same size and/or shape as the upper conductors 52. The magnetic component 12 includes electrical vias 56 that extend through the substrate 18 from the upper side 22 of the substrate 18 to the lower side 20 of the substrate 18. The electrical vias 56 are filled and/or plated with an electrically conductive material 58 to provide conductive pathways through the substrate 18. Opposite ends of each electrical via 56 are conductively coupled with corresponding upper conductors 52 and corresponding lower conductors 54. The electrical vias 56, the upper conductors 52, and the lower conductors 54 form looping (i.e., winding) conductive pathways that wrap around the magnetic body 14 multiple times. The electrical vias 56, the upper conductors 52, and the lower conductors 54 thereby form one or more conductive coils 16 that extend around the magnetic body 14. The combination of the conductive coils 16 and the magnetic body 14 form the magnetic component 12.

The magnetic component 12 may include any number of the conductive coils 16. In some embodiments, the magnetic component 12 includes two conductive coils 16 that are not conductively coupled with each other. The two conductive coils 16 may be inductively coupled with each other by the magnetic body 14 such that electric current passing through the one of the conductive coils 16 is inductively transferred to the other conductive coil 16.

Figure 3:
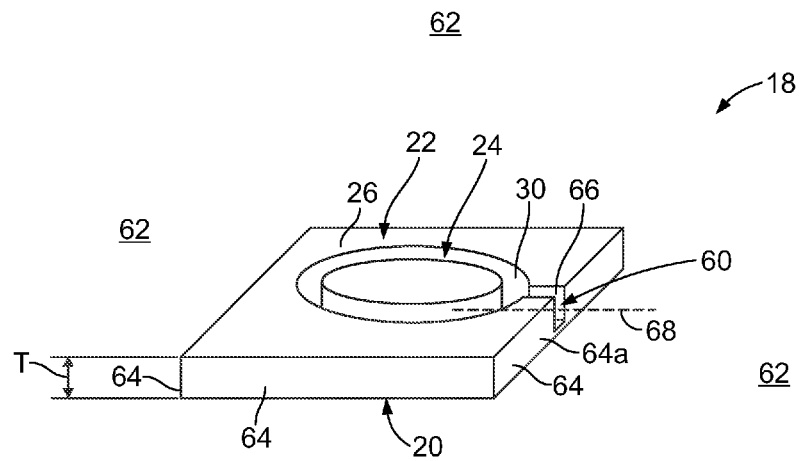
FIG. 3 is a perspective view of an exemplary embodiment of a substrate of the electronic device shown in FIGS. 1 and 2 illustrating an exemplary embodiment of a vent opening that extends within the substrate.

Referring now solely to FIG. 1, the electronic device 10 includes a vent opening 60 that extends within the substrate 18. As will be described below, the vent opening 60 fluidly connects the recess 24 to the atmosphere 62 to provide a pathway for fluid to flow from the recess 24 to the atmosphere 62. FIG. 3 is a perspective view of the substrate 18 of the electronic device 10 illustrating an exemplary embodiment of the vent opening 60. Referring now solely to FIG. 3, the substrate 18 includes one or more sidewalls 64 that extend between the upper side 22 and the lower side 20 of the substrate 18. The substrate 18 may include any number of the sidewalls 64. For example, the substrate 18 is shown as having a rectangular shape (i.e., the shape of a square parallelepiped) that includes four sidewalls 64. But, the substrate 18 is not limited to such a rectangular shape or four sidewalls 64. Rather, the substrate 18 may have any other shape that has any number of sidewalls 64, such as, but not limited to, a circular shape, a different rectangular shape (e.g., a non-square shape), a triangular shape, a multilateral shape, an irregular shape, a non-uniform shape, a non-symmetrical shape, and/or the like.

In the exemplary embodiment of the vent opening 60, the vent opening 60 includes a groove 66 that extends into the surface 26 of the upper side 22 of the substrate 18. The groove 66 is a hollow conduit that extends a length along a central longitudinal axis 68. The length of the groove 66 extends from the recess 24 to a corresponding sidewall 64a. The groove 66 extends through the sidewall 30 of the recess 24 such that the groove 66 intersects the recess 24 within the thickness T of the substrate 18. The hollow conduit of the groove 66 is thereby fluidly connected to the recess 24. The groove 66 extends through the sidewall 64a of the substrate 18 such that the hollow conduit of the groove 66 is fluidly connected to the atmosphere 62. In other words, the vent opening 60 defined by the groove 66 is open to the atmosphere 62 through the sidewall 64a. The groove 66 is thus fluidly connected between the recess 24 and the atmosphere 62 such that the vent opening 60 fluidly connects the recess 24 to the atmosphere 62. In other words, the recess 24 and the atmosphere 62 form a continuous space via the vent opening 60.

Figure 4:
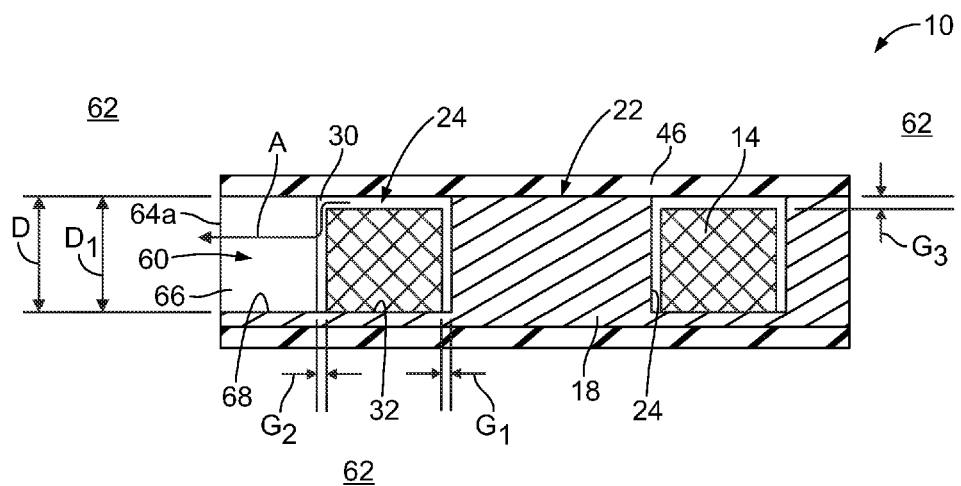
FIG. 4 is a cross-sectional view of the electronic device shown in FIGS. 1 and 2 taken along line 4-4 of FIG. 1.

FIG. 4 is a cross-sectional view of the electronic device 10 taken along line 4-4 of FIG. 1. Referring now solely to FIG. 4, the groove 66 of the vent opening 60 extends through the sidewalls 30 and 64a to fluidly connect the recess 24 to the atmosphere 62. In the exemplary embodiment of the vent opening 60, the groove 66 is closed along the upper side 22 of the substrate 18 by the dielectric layer 46 such that the vent opening 60 is only open to the atmosphere 62 through the sidewall 64a.

The vent opening 60 provides a pathway for fluid to flow from the recess 24 to the atmosphere 62, as indicated by the arrow A in FIG. 4. Specifically, the pathway provided by the vent opening 60 enables air, moisture, and/or other fluids to exhaust (i.e., vent) from the recess 24 to the atmosphere 62. For example, air, moisture, and/or other fluids that are contained within the gaps $G_1$, $G_2$, and/or $G_3$ can travel from the recess 24 to the atmosphere 62 through the path provided by the vent opening 60. The vent opening 60 may thereby facilitate preventing damage to the electronic device 10. For example, the vent opening 60 may prevent undesired air burst in relatively high pressure conditions. Specifically, and for example, when the electronic device 10 is subjected to an elevated temperature during a fabrication step (e.g., a solder reflow step), the vent opening 60 enables air expanding within the recess 24 to exhaust from the recess 24 to the atmosphere 62. Moreover, and for example, the vent opening 60 enables moisture and/or other fluids trapped within the recess 24 to exhaust from the recess 24 to the atmosphere 62. In some embodiments, the electronic device 10 is stacked with one or more other components (e.g., other planar electronic devices). In such embodiments wherein the electronic device 10 is stacked, the location of the fluid communication between the vent opening 60 and the atmosphere 62 at the sidewall 64a may enable more air, moisture, and/or other fluids to exhaust from the recess 24 to the atmosphere 62 as compared to a vent opening that fluidly communicates with the atmosphere 62 only through the dielectric layer 46 and/or 48.

Figure 5:
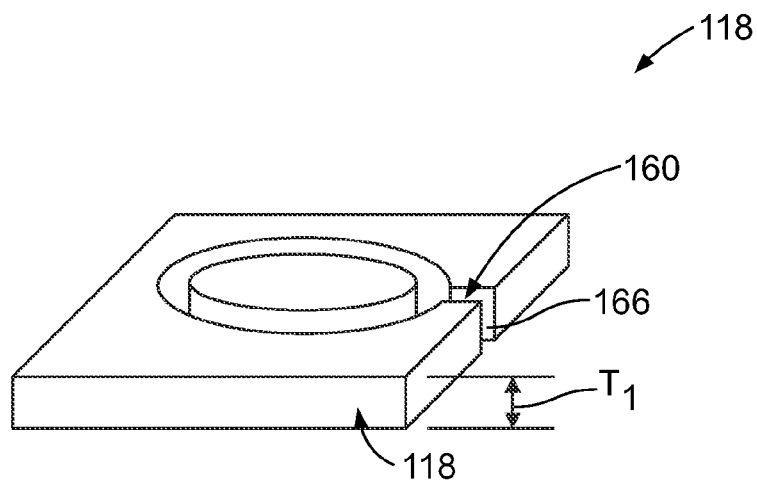
FIG. 5 is a cross-sectional view of another exemplary embodiment of a planar electronic device illustrating another exemplary embodiment of a vent opening.

The groove 66 of the vent opening 60 extends a depth $D_1$ into the substrate 18. The depth $D_1$ of the groove 66 may have any value relative to the depth D of the recess 24. In the exemplary embodiment, the depth $D_1$ of the groove 66 is approximately equal to the depth D of the recess 24 such that a bottom 69 of the groove 66 is approximately aligned with the bottom 32 of the recess 24. In other embodiments, the depth $D_1$ of the groove 66 is less than or greater than the depth D of the recess 24. In some embodiments, the groove 66 extends completely through the thickness T of the substrate 18 including through both the sides 20 and 22. For example, FIG. 5 is a cross-sectional view of another exemplary embodiment of a planar electronic device 110. The planar electronic device 110 includes a substrate 118 having a vent opening 160 that includes a groove 166 that extends completely through a thickness $T_1$ of the substrate 118. The groove 166 intersects a recess 124 of the electronic device 110 such that the groove 166 is fluidly connected to the recess 124. The groove 166 extends through a sidewall 164 of the substrate 118 such that the vent opening 160 fluidly connects the recess 124 to the atmosphere 162 through the sidewall 164 of the substrate 118. As can be seen in FIG. 5, the groove 166 is closed along an upper side 122 of the substrate 118 by a dielectric layer 146 of the electronic device 110, and the groove 166 is closed along a lower side 120 of the substrate 118 by a dielectric layer 148 of the electronic device 110.

Figure 6:
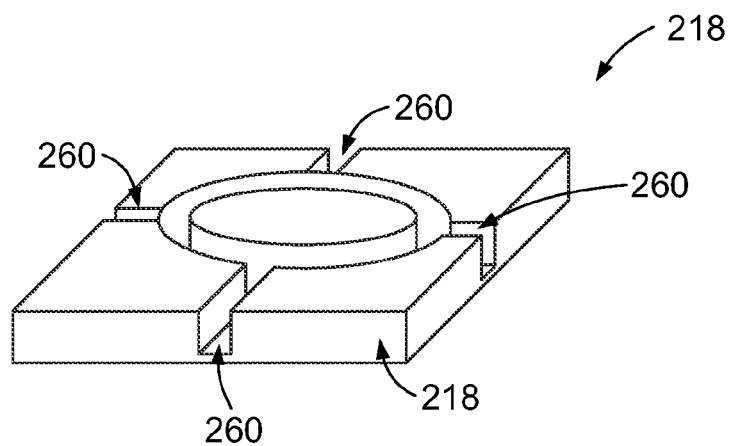
FIG. 6 is a perspective view of another exemplary embodiment of a substrate illustrating an exemplary embodiment of a plurality of discrete vent openings.

Referring again to FIG. 3, although only a single vent opening 60 is shown, the electronic device 10 may include any number of vent openings 60. For example, the electronic device 10 may include a plurality of discrete vent openings 60 that extend within the substrate 18 and do not directly intersect each other within the substrate 18. Moreover, and for example, the electronic device 10 may include a plurality of vent openings 60 wherein at least some of the vent openings 60 intersect each other within the substrate 18 such that the substrate 18 includes a network of vent openings 60. Such a network of vent openings 60 may have any pattern. FIG. 6 is a perspective view of another exemplary embodiment of a substrate 218 wherein the substrate 218 includes a plurality of discrete vent openings 260 that do not intersect each other within the substrate 218.

Figure 7:
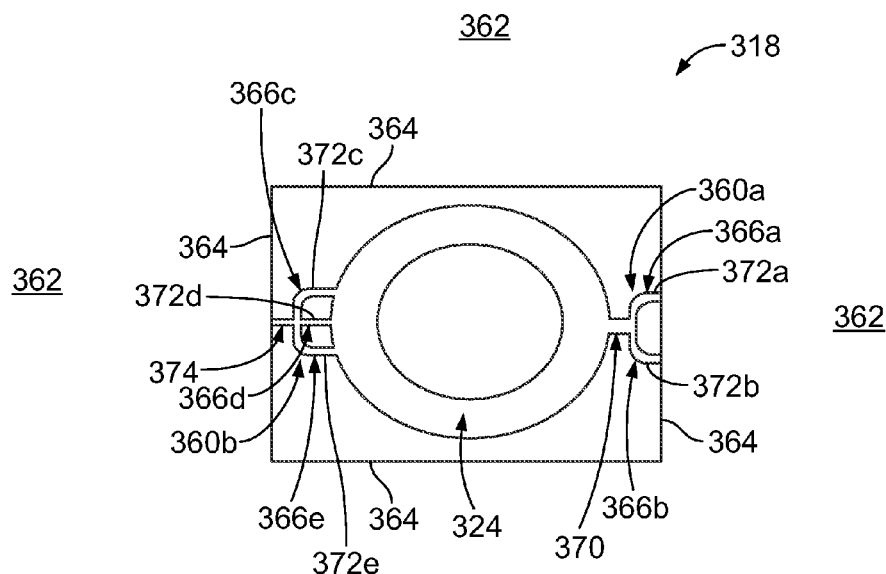
FIG. 7 is a top plan view of another exemplary embodiment of a substrate that may be used with the electronic device shown in FIGS. 1, 2, and 4.

Moreover, and referring again to FIG. 3, although the single vent opening 60 of the electronic device 10 is shown as including only a single path (i.e., the single groove 66) from the recess 24 to the atmosphere 62, each vent opening 60 may include any number of paths from the recess 24 to the atmosphere 62. For example, FIG. 7 is a top plan view of another exemplary embodiment of a substrate 318 for use with the electronic device 10. The substrate 318 includes vent openings 360a and 360b that extend within the substrate 318. The vent opening 360a includes two grooves 366a and 366b. The vent opening 360a includes a common base segment 370 that extends into a recess 324 of the substrate 318. Each of the grooves 366a and 366b includes the common base segment 370. But, the grooves 366a and 366b diverge from the common base segment 370 to discrete paths 372a and 372b, respectively, that extend through a sidewall 364 of the substrate 318. Each groove 366a and 366b thus provides a different respective path 372a and 372b from the recess 324 to the atmosphere 362. Although shown as extending through the same sidewall 364 of the substrate 318, in other embodiments, the grooves 366a and 366b extend through different sidewalls 364 of the substrate 318.

The vent opening 360b includes three grooves 366c, 366d, and 366e. The vent opening 360b includes a common base segment 374 that extends through a sidewall 364 of the substrate 318 into fluid communication with the atmosphere 362. Each of the grooves 366c, 366d, and 366e includes the common base segment 374. But, the grooves 366c, 366d, and 366e diverge from the common base segment 374 to discrete paths 372c, 372d, and 372e, respectively, that extend into the recess 324. Each groove 366c, 366d, and 366e thus provides a different respective path 372c, 372d, and 372e from the recess 324 to the atmosphere 362. Each vent opening 360a and 360b may include any number of the paths 372 (i.e., any number of the grooves 366). Moreover, each of the paths 372a, 372b, 372c, 372d, and 372e may have any shape.

Referring again to FIG. 3, the groove 66 of the vent opening 60 may include any size and/or shape. The size and/or shape of the groove 66, the number and/or pattern of vent openings 60, and/or the like may be selected to provide the electronic device 10 with a predetermined volume for venting air, moisture, and/or other fluids from the recess 24 to the atmosphere 62. In the exemplary embodiment, the groove 66 is shown as having a rectangular cross-sectional shape. But, the groove 66 may have any other cross-sectional shape, such as, but not limited to, a partially-circular cross-sectional shape, a different rectangular cross-sectional shape, a square cross-sectional shape, a triangular cross-sectional shape, a multilateral cross-sectional shape, an irregular cross-sectional shape, a non-uniform cross-sectional shape (e.g., along the length of the groove 66), a non-symmetrical cross-sectional shape, a cross-sectional shape having a curved side, a partially oval cross-sectional shape, and/or the like. The cross-sectional shape of the groove 66 may have any number of sides.

Figure 8A:
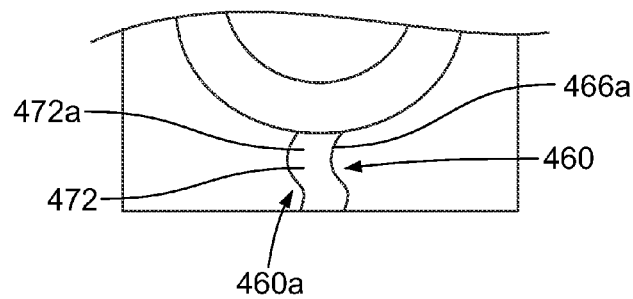
FIGS. 8a and 8b are top plan views illustrating exemplary alternative embodiments of vent opening paths.
Figure 8B:
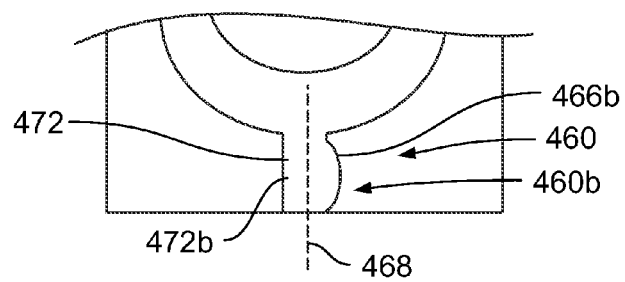

In the exemplary embodiment, the groove 66 extends along an approximately straight (i.e., linear) path. But, the path of the groove 66 may have any shape, such as, but not limited to, a curved path, a path having one or more non-zero angles, an irregular path, a non-uniform path, a path having opposing sidewalls that follow different paths and/or have different shapes, and/or the like. For example, the paths 372a-e of the respective grooves 366a-e shown in FIG. 7 are examples of non-linear and curved paths. Moreover, and for example, FIGS. 8a and 8b illustrate other exemplary embodiments of paths 472 of vent openings 460. Specifically, FIG. 8a illustrates a vent opening 460a that includes a groove 466a that extends along an irregular path 472a. The shape of the irregular path 472a shown herein is meant as exemplary only. The irregular path 472a may have any other irregular shape. FIG. 8b illustrates a vent opening 460b that includes a groove 466b having opposing sidewalls 467a and 467b. The groove 466b extends along a path 472b wherein the sidewalls 467a and 467b follow have different shapes and follow different paths. The shapes of the sidewalls 467a and 467b and the shape of the paths of the sidewalls 467a and 467 are meant as exemplary only. Each of the sidewalls 467a and 467b may have any shape and may follow any path.

Figure 9:
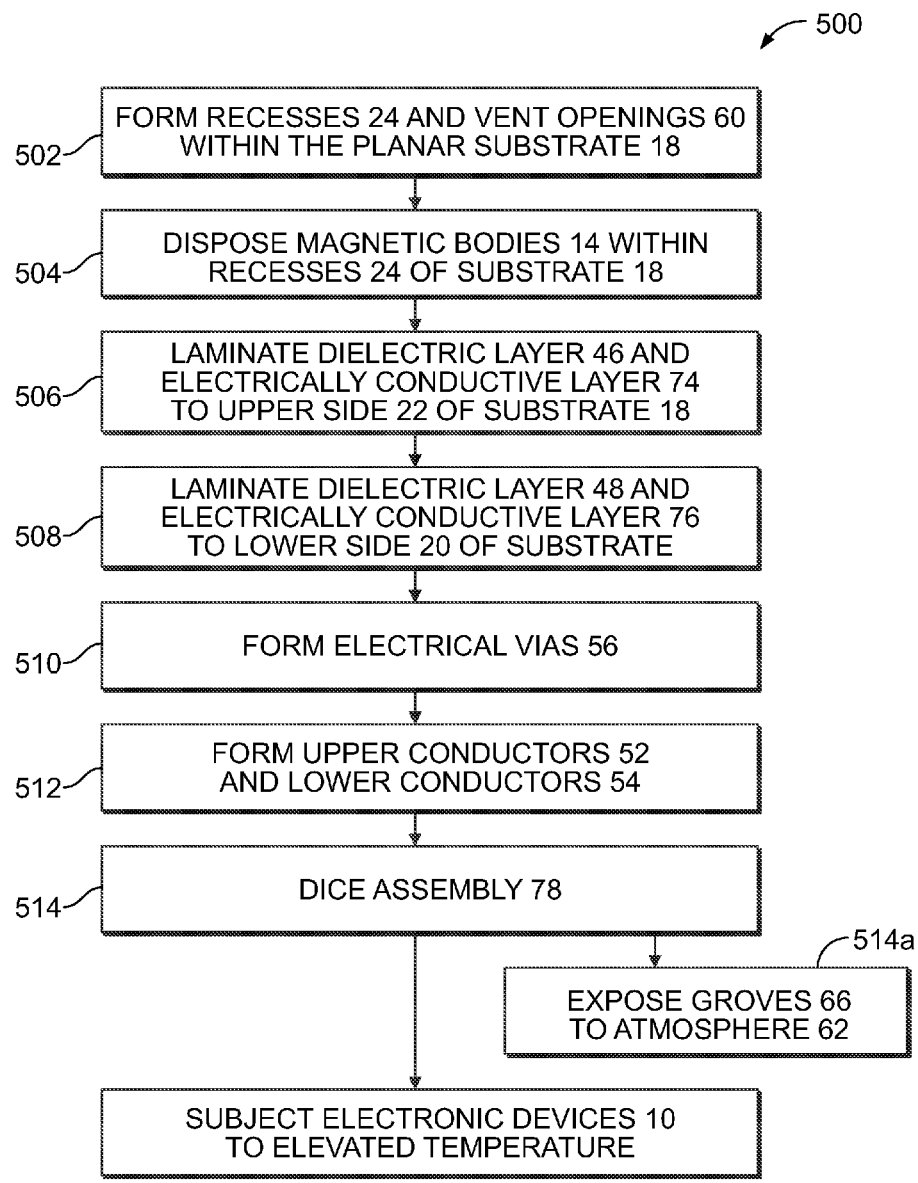
FIG. 9 is a flowchart of an exemplary embodiment of a method for fabricating one or more of the electronic device shown in FIGS. 1, 2, and 4.
Figure 10:
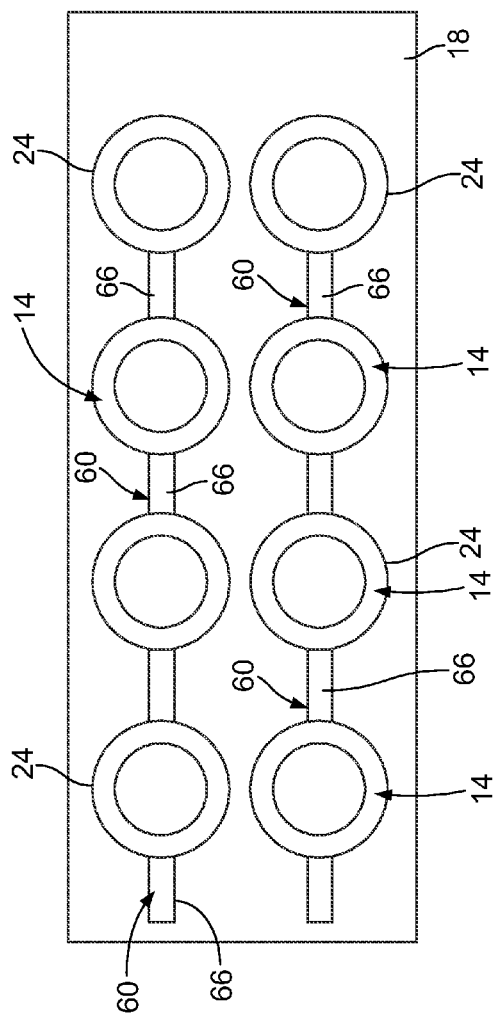
FIG. 10 is a top plan view illustrating the substrate shown in FIG. 3 after recesses and vent openings have been formed therein.

FIG. 9 is a flowchart of an exemplary embodiment of a method 500 for fabricating one or more of the electronic device 10 (shown in FIGS. 1, 2, and 4). The method 500 will be described herein with respect to fabricating a plurality of electronic devices 10. But, it should be understood that the method 500 may be used to fabricate a single electronic device 10. At 502, a plurality of the recesses 24 (shown in FIGS. 1-4 and 10) and a plurality of the vent openings 60 (shown in FIGS. 1, 3, 4, 10, and 12) are formed within the planar substrate 18 (shown in FIGS. 1-4, 10, and 12). In the exemplary embodiment of the method 500, forming the vent openings 60 at 502 includes forming a plurality of the grooves 66 (FIGS. 3, 4, 10, and 12) such that each groove 66 intersects at least one corresponding recess 24. FIG. 10 is a top plan view illustrating the substrate 18 having the recesses 24 and the grooves 66 of the vent openings 60 formed therein according to the method step 502. The recesses 24 and vent openings 60 may be formed at 502 using any process, means, and/or the like, such as, but not limited to, using a molding and/or casting process, using a chemical process, using a mechanical process, using radiation, drilling, cutting, routing, machining, milling, and/or the like.

Figure 11:
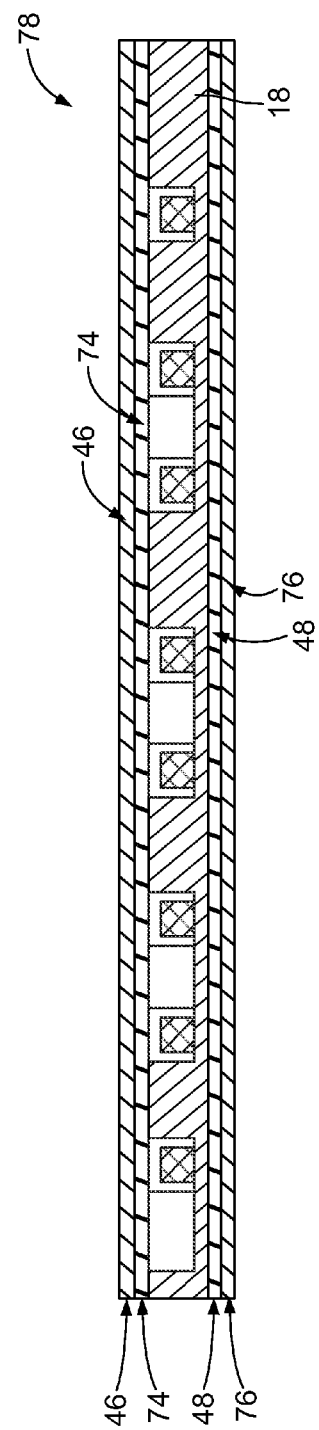
FIG. 11 is a cross-sectional view illustrating the substrate shown in FIG. 10 after conductive layers have been laminated thereto.

At 504, a magnetic body 14 is disposed within each of the recesses 24 formed within the planar substrate 18. FIG. 10 also illustrates the magnetic bodies 14 disposed within the recesses 24. At 506, the method 500 includes laminating the dielectric layer 46 and an electrically conductive layer 74 (shown in FIG. 11) to the upper side 22 of the substrate 18. At 508, the method 500 includes laminating the dielectric layer 48 and an electrically conductive layer 76 (shown in FIG. 11) to the lower side 20 of the substrate 18. In some other embodiments, the steps 506 and 508 may be performed as a single step of the method 500. Moreover, in some other embodiments, the electronic device 10 does not include the dielectric layer 48 and the electrically conductive layer 76 is laminated directly to the lower side 20 of the substrate 18, for example before the recesses 24 are formed at 502. FIG. 11 is a cross-sectional view that illustrates the layers 46, 74, 48, and 76 laminated to the substrate 18 according to the method steps 506 and 508. In some alternative embodiments, instead of laminating the layers 46, 74, 58, and 76 on the substrate 18, the substrate 18 is provided before step 502 of the method 500 with the conductive layers 74 and/or 76 already thereon (whether or not the dielectric layers 46 and/or 48 are included).

At 510, the method 500 includes forming the electrical vias 56 that extend through the conductive layer 74, the dielectric layer 46, the substrate 18, the dielectric layer 48, and the conductive layer 76. The electrical vias 56 (shown in FIGS. 1 and 2) may be formed using any process, means, and/or the like, such as, but not limited to, using a drilling process, using a chemical process, using a filling process, using a plating process, and/or the like. The electrical vias 56 can be seen in FIG. 2. The electrical vias 56, the upper conductors 52, and the lower conductors 54 form the one or more conductive coils 16 (shown in FIGS. 1 and 2) of the electronic devices 10.

Once the electrical vias 56 have been formed at 510, the electrically conductive layers 74 and 76 are patterned through a chemical process (such as, but not limited to, etched and/or the like) to form, at 512, the upper conductors 52 (shown in FIGS. 1 and 2) on the dielectric layer 46 and the lower conductors 54 (shown in FIG. 2) on the dielectric layer 48. The conductors 52 and 54 can be seen in FIG. 2. It should be understood that, in some embodiments, the method step 512 is the last step of the method 500 that includes processes such as silkscreen, soldermask, metallization, and/or the like.

Figure 12:
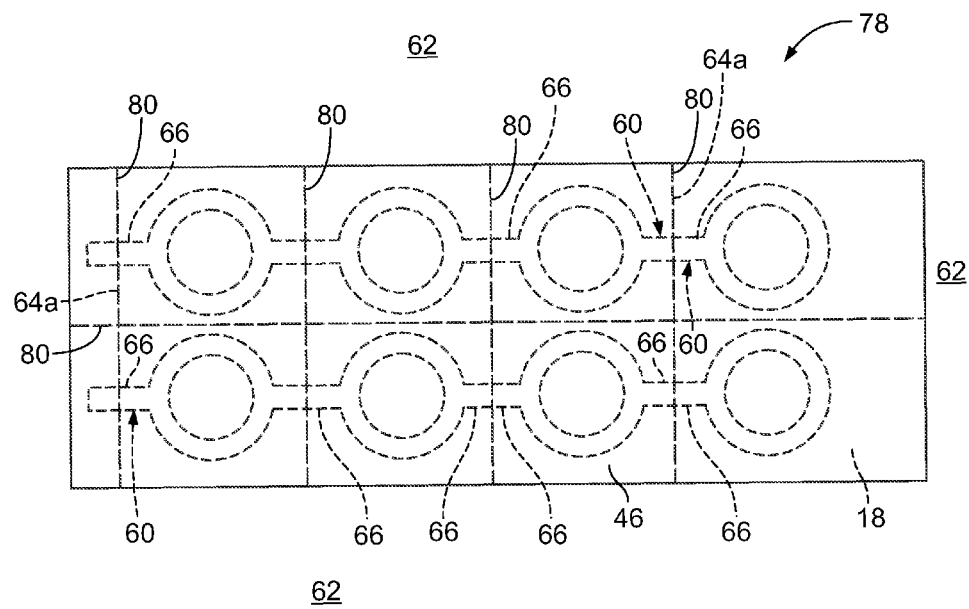
FIG. 12 illustrates an exemplary embodiment of dicing of the substrate shown in FIG. 11.

An assembly 78 (shown in FIG. 12) of the substrate 18, the magnetic bodies 14, and the coils 16 is then diced at 514 to divide the assembly 78 into a plurality of the electronic devices 10. As used herein, the term "dicing" is intended to mean any separating operation, such as, but not limited to, cutting, severing, sawing, singling, and/or the like. Dicing the assembly 78 at 514 includes exposing, at 514a, the grooves 66 of the vent openings 60 to the atmosphere. Specifically, FIG. 12 illustrates the dicing of the assembly 78 at 514. The conductors 52 and 54 and the electrical vias 56 (i.e., the coils 16) have been removed from FIG. 12 for clarity. As can be seen in FIG. 12, the assembly 78 is diced along dicing lines 80 that intersect the grooves 66. Accordingly, as the assembly 78 is diced along the dicing lines 80, the grooves 66 are exposed in fluid communication with the atmosphere 62. Specifically, dicing along the dicing lines 80 forms the corresponding sidewall 64a through which each groove 66 extends into fluid communication with the atmosphere 62. The dicing step 514 may be formed using any process, means, and/or the like, such as, but not limited to, using a mechanical process (such as, but not limited to, drilling, cutting, routing, machining, milling, and/or the like), using a chemical process, using radiation, and/or the like.

In embodiments wherein the method 500 is used to fabricate a single electronic device 10, the assembly 78 may be diced along any line that exposes the groove(s) 66 in fluid communication with the atmosphere.

Optionally, the method 500 may include subjecting, at 516, the electronic devices 10 to an elevated temperature (e.g., baking the electronic devices 10) to exhaust any remaining moisture and/or other fluids from recesses 24 through the vent openings 60.

The method 500 may be less costly and/or less labor intensive than at least some known methods for fabricating planar electronic devices. For example, some known planar electronic devices include vent openings that extend through a dielectric layer that is disposed above or below the planar substrate of the device. Such known vent openings are formed after the dielectric layer and conductive layer have been laminated to the substrate. But, because the recesses 24 and vent openings 60 are formed during the same general method step, the method 500 eliminates the additional step of forming a vent opening through a dielectric layer after the dielectric layer and the conductive layer have been laminated to the substrate. The elimination of such an additional forming step may reduce the cost of fabricating a planar electronic device and/or may reduce the amount of labor required to fabricate a planar electronic device.

Moreover, the method 500 and/or the structure of the electronic device 10 may reduce or eliminate any damage to the magnetic body 14 during fabrication of the electronic device 10. For example, known vent openings are formed through the dielectric layer while the magnetic body is disposed within the recess of the substrate. Accordingly, the drilling and/or other process used to form known vent openings may damage the magnetic body (e.g., via contact with a drill bit or other tool). But, because the vent openings 60 are formed before the magnetic bodies 14 are disposed within the recesses 24, any tools used to form the vent openings 60 will not damage the magnetic bodies 14. Moreover, the method 500 may facilitate cleaning of various components of the electronic device 10 without damaging the magnetic bodies 14. For example, because the vent openings 60 are not exposed to the atmosphere until the dicing step 514, various components of the electronic device 10 can be cleaned before the dicing step 514 without any cleaning materials leaking into the recesses 24 through the vent openings 60 and thereby damaging the magnetic bodies 14.

Figure 13:
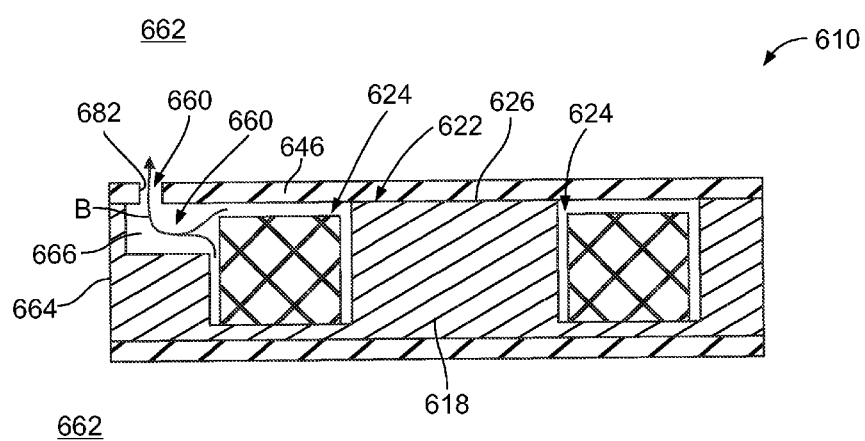
FIG. 13 is a cross-sectional view of another exemplary embodiment of a planar electronic device.

Referring again to FIG. 4, and as described above, the groove 66 is closed along the upper side 22 of the substrate 18 by the dielectric layer 46 such that the vent opening 60 is only open to the atmosphere 62 through the sidewall 64a in the exemplary embodiment of the vent opening 60. But, in addition or alternatively to being open to the atmosphere 62 through the sidewall 64a, the vent opening 60 may be open to the atmosphere 62 through the dielectric layer 46. For example, FIG. 13 is a cross-sectional view of another exemplary embodiment of a planar electronic device 610. The electronic device 610 includes a vent opening 660. The vent opening 660 includes a groove 666 that extends into a surface 626 of an upper side 622 of a planar dielectric substrate 618 of the electronic device 610. The groove 666 intersects a recess 624 of the electronic device 610 such that the groove 666 is fluidly connected to the recess 624.

In addition to the groove 666, the vent opening 660 includes a dielectric layer segment 682 that extends through a dielectric layer 646 of the electronic device 610. The dielectric layer segment 682 is at least partially aligned with the groove 666 such that the dielectric layer segment 682 is fluidly connected to the groove 666. The dielectric layer segment 682 extends through the dielectric layer 646 such that the dielectric layer segment 682 of the vent opening 660 is open to the atmosphere 662 through the dielectric layer 646. Accordingly, the groove 666 and the dielectric layer segment 682 of the vent opening 660 fluidly connect the recess 624 to the atmosphere 662. The vent opening 660 thereby provides a pathway for air, moisture, and/or other fluids to exhaust from the recess 624 to the atmosphere 662, as indicated by the arrow B in FIG. 13. In some alternative embodiments, in addition to being open to the atmosphere through the dielectric layer 646, the vent opening 660 (e.g., the groove 666) extends through a sidewall 664 of the substrate 618 such that the vent opening 660 fluidly connects to the atmosphere 662 through both the sidewall 664 of the substrate 618 and the dielectric layer 646. The dielectric layer segment 682 of the vent opening 660 may have any size and/or shape.

In some alternative embodiments (e.g., embodiments wherein the groove 666 extends into a lower side 620 of the substrate 618 and/or extends completely through a thickness of the substrate 618), in addition or alternative to being open to the atmosphere 662 through the dielectric layer 646, the vent opening 660 includes a dielectric layer segment (not shown) that extends through a dielectric layer 646 of the electronic device 610 such that the vent opening 660 fluidly connects to the atmosphere 662 through the dielectric layer 646.

The method 500 described above with reference to FIG. 9 may be used to fabricate the electronic device 610. For example, an additional step (not shown) of forming the dielectric layer segment 682 of the vent opening 660 may be included in the method 500, for example after laminating the dielectric layer 646 to the substrate 618. Moreover, when the method 500 is used to fabricate the electronic device 610, a dicing line 80 (shown in FIG. 12) may or may not intersect the groove 666. The dielectric layer segment 682 of the vent opening 660 may be formed using any process, means, and/or the like, such as, but not limited to, using a molding and/or casting process, using radiation, using a chemical process, using a mechanical process (such as, but not limited to, drilling, cutting, routing, machining, milling, and/or the like), and/or the like.

Figure 22:
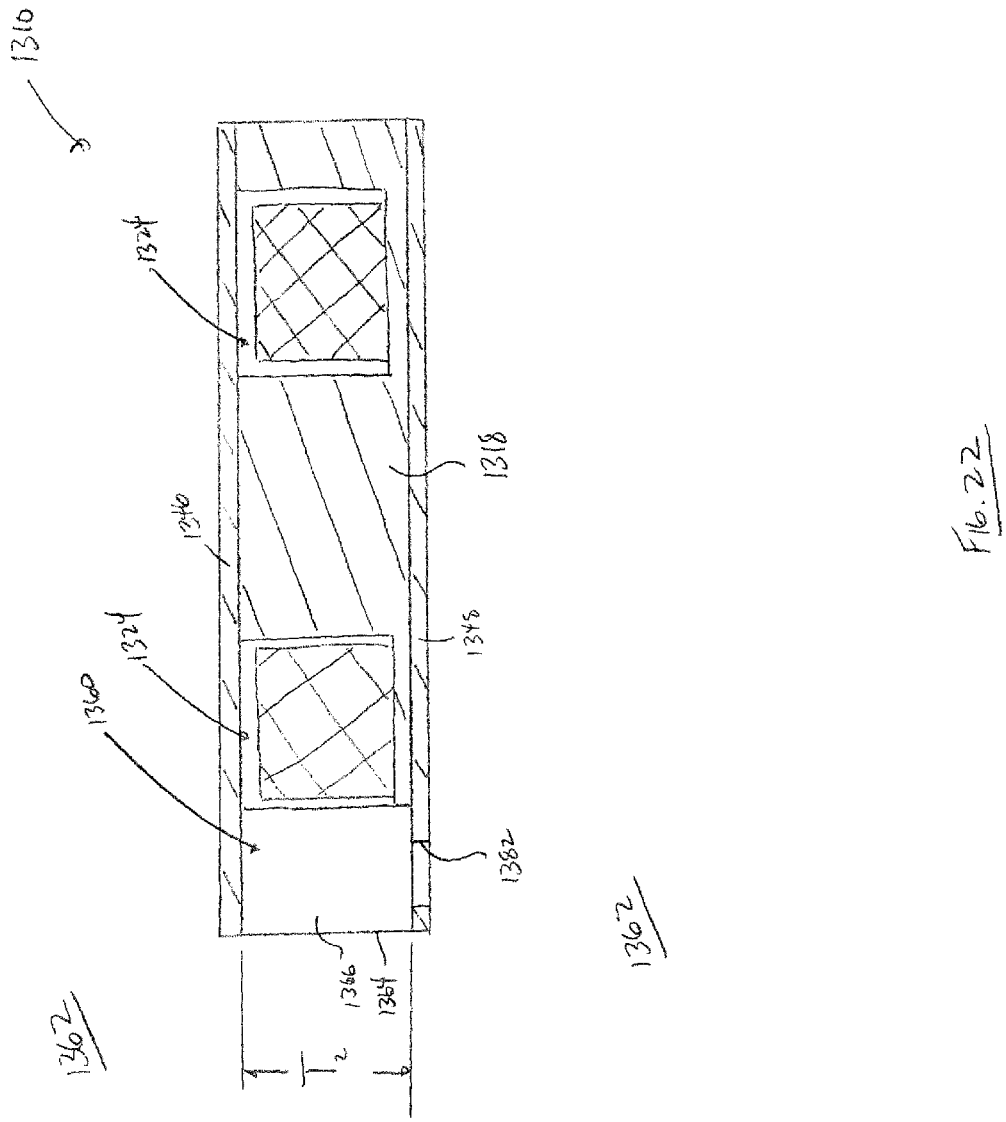
FIG. 22 is a cross-sectional view of another exemplary embodiment of a planar electronic device.

Moreover, and for example, FIG. 22 is a cross-sectional view of another exemplary embodiment of a planar electronic device 1310. The planar electronic device 1310 includes a vent opening 1360 that includes a groove 1366 that extends completely through a thickness $T_2$ of a substrate 1318 of the electronic device 1310. The groove 1366 intersects a recess 1324 of the electronic device 1310 such that the groove 1366 is fluidly connected to the recess 1324. The groove 1366 extends through a sidewall 1364 of the substrate 1318 such that the vent opening 1360 fluidly connects to the atmosphere 1362 through the sidewall 1364 of the substrate 1318. In addition to the groove 1366, the vent opening 1360 includes a dielectric layer segment 1382 that extends through a dielectric layer 1348 of the electronic device 1310. The dielectric layer segment 1382 is at least partially aligned with the groove 1366 such that the groove 1366 and the dielectric layer segment 1382 fluidly connect the recess 1324 to the atmosphere 1362. Accordingly, the vent opening 1360 fluidly connects to the atmosphere 1362 through both the sidewall 1364 of the substrate 1318 and through the dielectric layer 1348. In some alternative embodiments, in addition or alternative to being open to the atmosphere 1362 through the dielectric layer 1348, the vent opening 1360 includes a dielectric layer segment (not shown) that extends through a dielectric layer 1346 of the electronic device 1310 such that the vent opening 1360 fluidly connects to the atmosphere 1362 through the dielectric layer 1346.

Figure 14:
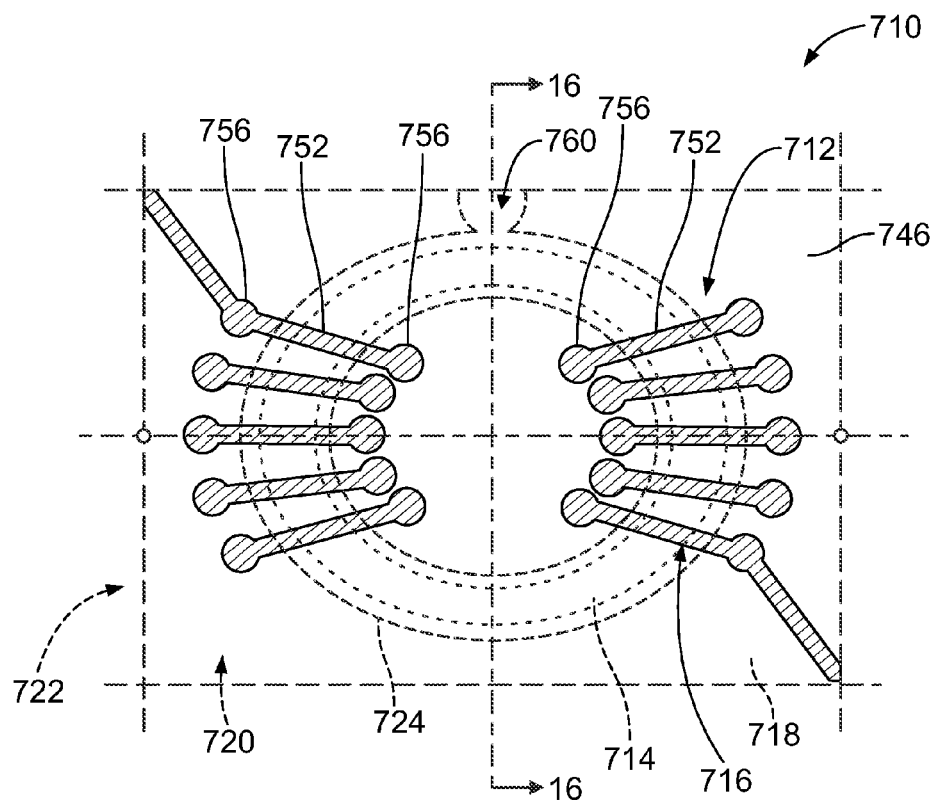
FIG. 14 is a top plan view of another exemplary embodiment of a planar electronic device.

FIG. 14 is a top plan view of another exemplary embodiment of a planar electronic device 710. The planar electronic device 710 includes a planar dielectric substrate 718 and a magnetic component 712. The magnetic component 712 includes a magnetic body 714 and one or more conductive coils 716 that extend around the magnetic body 714. The substrate 718 extends a thickness from a lower side 720 to an opposite upper side 722. The substrate 718 includes sidewalls 764 (shown in FIG. 15) that extend from the upper side 722 to the lower side 720. The substrate 718 includes a recess 724 within which the magnetic body 714 is disposed.

A dielectric layer 746 is disposed above the upper side 722 of the substrate 718. The electronic device 710 includes a dielectric layer 748 (shown in FIG. 16) that is disposed below the lower side 720 of the substrate 718. The magnetic component 712 includes upper conductors 752 disposed above the upper side 722 of the substrate 718, and lower conductors (not shown) disposed below the lower side 720 of the substrate 718. The magnetic component 712 includes electrical vias 756 that extend through the substrate 718. The electrical vias 756, the upper conductors 752, and the lower conductors form the one or more conductive coils 716 that extend around the magnetic body 714.

Figure 15:
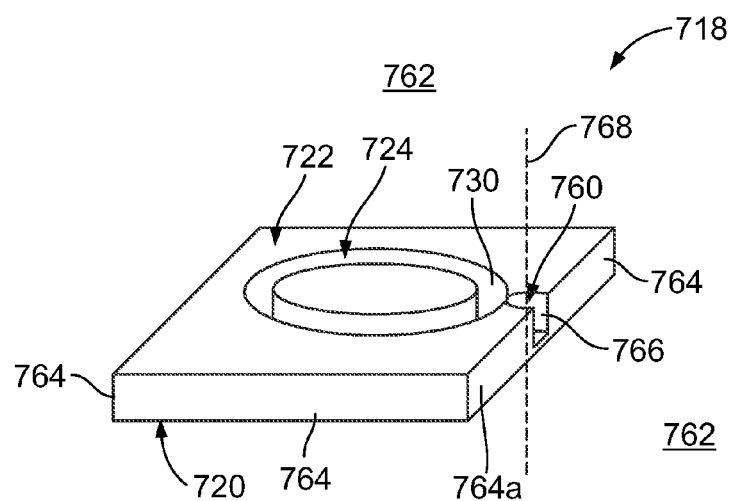
FIG. 15 is a perspective view of an exemplary embodiment of a substrate of the electronic device shown in FIG. 14 illustrating an exemplary embodiment of a vent opening that extends within the substrate.

The electronic device 710 includes a vent opening 760 that extends within the substrate 718. FIG. 15 is a perspective view of the substrate 718 of the electronic device 710 illustrating the vent opening 760. The vent opening 760 includes a hole 766 that extends through at least a portion of the thickness of the substrate 718. The hole 766 is a hollow conduit that extends a depth $D_2$ (shown in FIG. 16) along a central longitudinal axis 768. The hole 766 extends through the sidewall 730 of the recess 724 such that the hole 766 intersects the recess 724. The hollow conduit of the hole 766 is thereby fluidly connected to the recess 724. The hole 766 intersects a corresponding sidewall 764a of the substrate 718 such that the hollow conduit of the hole 766 is fluidly connected to the atmosphere 762. In other words, the vent opening 760 defined by the hole 766 is open to the atmosphere 762 through the sidewall 764a. The hole 766 is thus fluidly connected between the recess 724 and the atmosphere 762 such that the vent opening 760 fluidly connects the recess 724 to the atmosphere 762.

Figure 16:
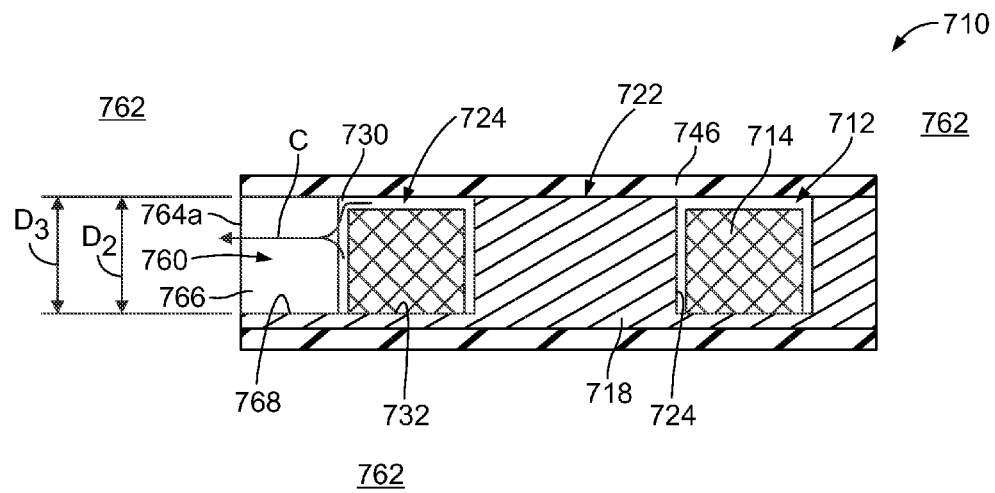
FIG. 16 is a cross-sectional view of the electronic device shown in FIG. 14 taken along line 16-16 of FIG. 14.

FIG. 16 is a cross-sectional view of the electronic device 710 taken along line 16-16 of FIG. 14. In the exemplary embodiment of the vent opening 760, the hole 766 is closed along the upper side 722 of the substrate 718 by the dielectric layer 746 and is closed along the lower side 720 by the dielectric layer 748 such that the vent opening 760 is only open to the atmosphere 762 through the sidewall 764a. The vent opening 760 provides a pathway for fluid to flow from the recess 724 to the atmosphere 762, as indicated by the arrow C in FIG. 16. Specifically, the pathway provided by the vent opening 760 enables air, moisture, and/or other fluids to exhaust (i.e., vent) from the recess 724 to the atmosphere 762.

The recess 724 of the substrate 718 extends a depth $D_3$ to a bottom 732. Opposing sidewalls 728 and 730 of the recess 724 extend along the depth $D_3$ of the recess 724. The depth $D_2$ of the hole 766 may have any value relative to the depth $D_3$ of the recess 724. In the exemplary embodiment, the depth $D_2$ of the hole 766 is approximately equal to the depth $D_3$ of the recess 724 such that a bottom 769 of the hole 766 is approximately aligned with the bottom 732 of the recess 724. In other embodiments, the depth $D_2$ of the hole 766 is less than or greater than the depth $D_3$ of the recess 724. In some embodiments, the hole 766 extends completely through the thickness of the substrate 718. For example, FIG. 23 is a cross-sectional view of another exemplary embodiment of a planar electronic device 1410. The planar electronic device 1410 includes a substrate 1418 having a vent opening 1460 that includes a hole 1466 that extends completely through a thickness $T_3$ of the substrate 1418. The hole 1466 intersects a recess 1424 of the electronic device 1410 such that the hole 1466 is fluidly connected to the recess 1424. The hole 1466 intersects a sidewall 1464 of the substrate 1418 such that the vent opening 1460 fluidly connects the recess 1424 to the atmosphere 1462 through the sidewall 1464 of the substrate 1418. As can be seen in FIG. 23, the hole 1466 is closed along an upper side 1422 of the substrate 1418 by a dielectric layer 1446 of the electronic device 1410, and the hole 1466 is closed along a lower side 1420 of the substrate 1418 by a dielectric layer 1448 of the electronic device 1410. In some embodiments, it may be easier and/or less costly to form the hole of vent opening when the hole extends completely through the substrate.

Moreover, and for example, FIG. 24 is a cross-sectional view of another exemplary embodiment of a planar electronic device 1510. The planar electronic device 1510 includes a vent opening 1560 that includes a hole 1566 that extends completely through a thickness $T_4$ of a substrate 1518 of the electronic device 1510. The hole 1566 intersects a recess 1524 of the electronic device 1510 such that the hole 1566 is fluidly connected to the recess 1524. The hole 1566 extends through a sidewall 1564 of the substrate 1518 such that the vent opening 1560 fluidly connects to the atmosphere 1562 through the sidewall 1564 of the substrate 1518. In addition to the hole 1566, the vent opening 1560 includes a dielectric layer segment 1582 that extends through a dielectric layer 1548 of the electronic device 1510. The dielectric layer segment 1582 is at least partially aligned with the hole 1566 such that the hole 1566 and the dielectric layer segment 1582 fluidly connect the recess 1524 to the atmosphere 1562. Accordingly, the vent opening 1560 fluidly connects to the atmosphere 1562 through both the sidewall 1564 of the substrate 1518 and through the dielectric layer 1548. In some alternative embodiments, in addition or alternative to being open to the atmosphere 1562 through the dielectric layer 1548, the vent opening 1560 includes a dielectric layer segment (not shown) that extends through a dielectric layer 1546 of the electronic device 1510 such that the vent opening 1560 fluidly connects to the atmosphere 1562 through the dielectric layer 1546.

Referring again to FIG. 14, although only a single vent opening 760 is shown, the electronic device 710 may include any number of vent openings 760. Moreover, each vent opening 760 may include any number of paths from the recess 724 to the atmosphere 762. The hole 766 of the vent opening 760 may include any size and/or shape. The size and/or shape of the hole 766, the number and/or pattern of vent openings 760, and/or the like may be selected to provide the electronic device 710 with a predetermined volume for venting air, moisture, and/or other fluids from the recess 724 to the atmosphere 762. In the exemplary embodiment, the hole 766 is shown as having a partially circular cross-sectional shape in a plane that is approximately parallel to the side 722. But, the hole 766 may have any other cross-sectional shape, such as, but not limited to, a different curved cross-sectional shape, a circular cross-sectional shape, a square cross-sectional shape, a partially square cross-sectional shape, a triangular cross-sectional shape, a partially triangular cross-sectional shape, a rectangular cross-sectional shape, a partially rectangular cross-sectional shape, a multilateral cross-sectional shape, an irregular cross-sectional shape, a non-uniform cross-sectional shape (e.g., along the depth $D_2$ of the hole 766), a non-symmetrical cross-sectional shape (e.g., about the central longitudinal axis 768), a cross-sectional shape having a curved side, an oval cross-sectional shape, a partially oval cross-sectional shape and/or the like. The cross-sectional shape of the hole 766 may have any number of sides.

In the exemplary embodiment, the depth $D_2$ of the hole 766 extends along an approximately straight (i.e., linear) path that extends approximately perpendicular to the sides 720 and 722. But, the path of the depth $D_2$ of the hole 766 may have any shape, such as, but not limited to, a curved path, a path having one or more non-zero angles, an irregular path, a non-uniform path, a path having opposing sidewalls that follow different paths and/or have different shapes, an approximately straight path that extends non-perpendicular to the sides 720 and 722, and/or the like.

The method 500 described above with reference to FIG. 9 may be used to fabricate the electronic device 710. For example, when the method 500 is used to fabricate the electronic device 710, a dicing line 80 (shown in FIG. 12) intersects the hole 766. Accordingly, as the substrate 718 is diced along the dicing line 80, the hole 766 is exposed in fluid communication with the atmosphere 762. Dicing through the hole 766 may divide the hole 766 from a closed cross-sectional shape (e.g., a closed circular, a closed rectangular, a closed oval, a closed triangular shape, a closed square shape, and/or the like) into an open cross-sectional shape (e.g., a partially circular shape, a partially rectangular shape, a partially oval shape, a partially triangular shape, a partially square shape, and/or the like).

Figure 17:
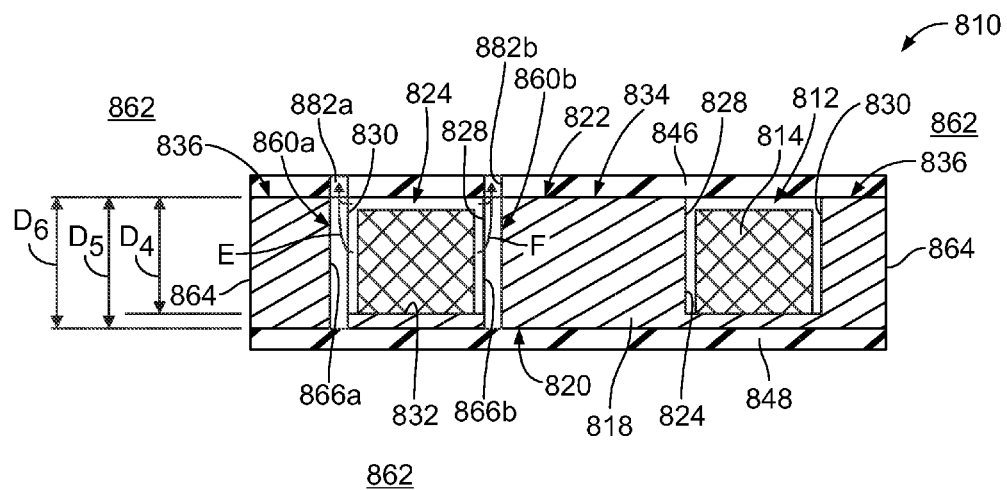
FIG. 17 is a cross-sectional view of another exemplary embodiment of a planar electronic device.

FIG. 17 is a cross-sectional view of another exemplary embodiment of a planar electronic device 810. The planar electronic device 810 includes a planar dielectric substrate 818 and a magnetic component 812, which includes a magnetic body 814 and one or more conductive coils (not shown) that extend around the magnetic body 814. The substrate 818 extends a thickness from a lower side 820 to an opposite upper side 822. The substrate 818 includes sidewalls 864 that extend from the upper side 822 to the lower side 820. The substrate 818 includes a recess 824 within which the magnetic body 814 is disposed. The recess 824 divides the upper side 822 of the substrate 818 into an interior segment 834 and a perimeter segment 836. The recess 824 of the substrate 818 extends a depth $D_4$ to a bottom 832. Opposing sidewalls 828 and 830 of the recess 824 extend along the depth $D_4$ of the recess 824. A dielectric layer 846 is disposed above the upper side 822 of the substrate 818 and a dielectric layer 848 is disposed below the lower side 820 of the substrate 818.

The electronic device 810 includes vent openings 860a and 860b that extend within the substrate 818. The vent openings 860a and 860b include respective holes 866a and 866b that extend through at least a portion of the thickness of the substrate 818. The hole 866a of the vent opening 860a is a hollow conduit that extends a depth $D_5$ along a central longitudinal axis 868a. The hole 866a extends through the sidewall 830 of the recess 824 such that the hole 866a intersects the recess 824. The hollow conduit of the hole 866a is thereby fluidly connected to the recess 824. As can be seen in FIG. 17, the hole 866a extends through the perimeter segment 836 of the substrate 818. The depth $D_5$ of the hole 866a may have any value relative to the depth $D_4$ of the recess 824. In the exemplary embodiment, the depth $D_5$ of the hole 866a extends completely through the thickness of the substrate 818. In other embodiments, the depth $D_5$ of the hole 866a is approximately equal to, greater than, or less than the depth $D_4$ of the recess 824.

The hole 866b of the vent opening 860b is a hollow conduit that extends a depth $D_6$ along a central longitudinal axis 868b. The hole 866b extends through the sidewall 828 of the recess 824 such that the hole 866b intersects the recess 824. The hollow conduit of the hole 866b is thereby fluidly connected to the recess 824. As can be seen in FIG. 17, the hole 866b extends through the interior segment 834 of the substrate 818. The depth $D_6$ of the hole 866b may have any value relative to the depth $D_4$ of the recess 824. In the exemplary embodiment, the depth $D_6$ of the hole 866b extends completely through the thickness of the substrate 818. In other embodiments, the depth $D_6$ of the hole 866b is approximately equal to, greater than, or less than the depth $D_4$ of the recess 824.

In addition to the hole 866a, the vent opening 860a includes a dielectric layer segment 882a that extends through the dielectric layer 846 of the electronic device 810. The dielectric layer segment 882a is at least partially aligned with the hole 866a such that the dielectric layer segment 882a is fluidly connected to the hole 866a. The dielectric layer segment 882a may have the same or a different size (e.g., diameter) and/or shape as compared to the hole 866a. The dielectric layer segment 882a extends through the dielectric layer 846 such that the dielectric layer segment 882a of the vent opening 860a is open to the atmosphere 862 through the dielectric layer 846. Accordingly, the hole 866a and the dielectric layer segment 882a of the vent opening 860a fluidly connect the recess 824 to the atmosphere 862. The vent opening 860a thereby provides a pathway for air, moisture, and/or other fluids to exhaust from the recess 824 to the atmosphere 862, as indicated by the arrow E in FIG. 17. The dielectric layer segment 882a may be a microvia type opening.

Figure 18:
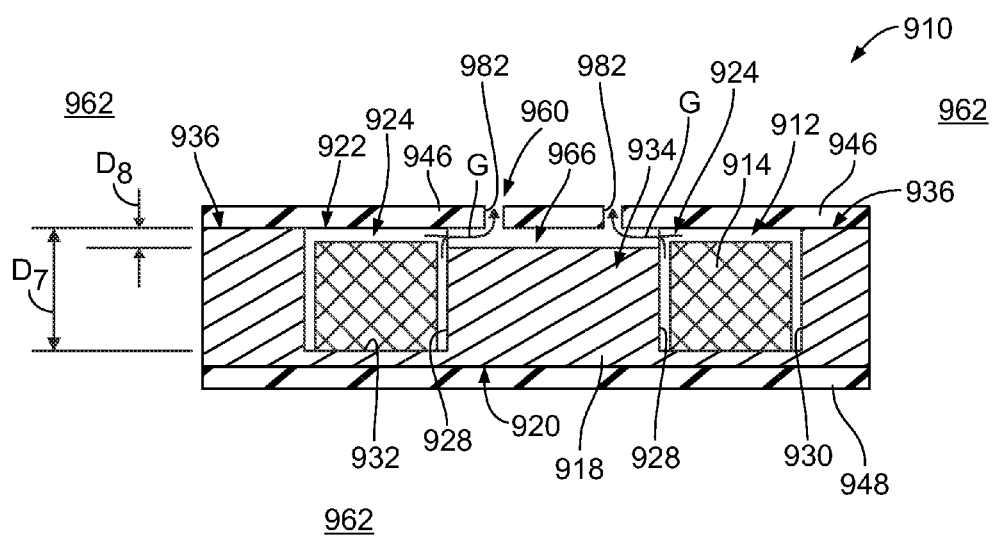
FIG. 18 is a cross-sectional view of another exemplary embodiment of a planar electronic device.

As can be seen in FIG. 17, the hole 866a does not extend through any sidewall 864 of the substrate 818 such that the vent opening 860a is not open to the atmosphere 862 through any sidewalls 864 of the substrate 818. In some embodiments, in addition or alternative to being open to the atmosphere through the dielectric layer 846 via the dielectric layer segment 882a, the vent opening 860a includes a dielectric layer segment (not shown) that extends through the dielectric layer 848 such that the vent opening 860a fluidly connects to the atmosphere 862 through dielectric layer 848. For example, FIG. 18 is a cross-sectional view of another exemplary embodiment of a planar electronic device 910 having a vent opening 960a. The vent opening 960a includes a hole 966a that extends through a perimeter segment 936 of a substrate 918 of the electronic device 910. The vent opening 960a also includes a dielectric layer segment 982a that extends through a dielectric layer 946 of the electronic device 910 and another dielectric layer segment 982c that extends through another dielectric layer 948 of the electronic device 910. The hole 966a and the dielectric layer segments 982a and 982c of the vent opening 960a fluidly connect a recess 924 of the substrate 918 to the atmosphere 962.

Referring again to FIG. 17, in addition to the hole 866b, the vent opening 860b includes a dielectric layer segment 882b that extends through the dielectric layer 846 of the electronic device 810. The dielectric layer segment 882b is at least partially aligned with the hole 866b such that the dielectric layer segment 882b is fluidly connected to the hole 866b. The dielectric layer segment 882b may have the same or a different size (e.g., diameter) and/or shape as compared to the hole 866b. The dielectric layer segment 882b extends through the dielectric layer 846 such that the dielectric layer segment 882b of the vent opening 860b is open to the atmosphere 862 through the dielectric layer 846. Accordingly, the hole 866b and the dielectric layer segment 882b of the vent opening 860b fluidly connect the recess 824 to the atmosphere 862. The vent opening 860b thereby provides a pathway for air, moisture, and/or other fluids to exhaust from the recess 824 to the atmosphere 862, as indicated by the arrow F in FIG. 17. The dielectric layer segment 882b may be a microvia type opening.

As can be seen in FIG. 17, the hole 866b does not extend through any sidewall 864 of the substrate 818 such that the vent opening 860b is not open to the atmosphere 862 through any sidewalls 864 of the substrate 818. In some embodiments, in addition or alternative to being open to the atmosphere through the dielectric layer 846 via the dielectric layer segment 882b, the vent opening 860b includes a dielectric layer segment (not shown) that extends through the dielectric layer 848 such that the vent opening 860b fluidly connects to the atmosphere 862 through dielectric layer 848. For example, as shown in FIG. 18, the electronic device 910 includes a vent opening 960b having a hole 966b that extends through an interior segment 934 of the substrate 918 of the electronic device 910. The vent opening 960b also includes a dielectric layer segment 982b that extends through the dielectric layer 946 of the electronic device 910 and another dielectric layer segment 982d that extends through the dielectric layer 948 of the electronic device 910. The hole 966b and the dielectric layer segments 982b and 982d of the vent opening 960b fluidly connect the recess 924 of the substrate 918 to the atmosphere 962.

Referring again to FIG. 17, the electronic device 810 may include any number of the vent openings 860a and any number of the vent openings 860b. In some embodiments, the electronic device 810 may include only the vent opening(s) 860a or only the vent opening(s) 860b. Moreover, although shown as having the same location along the length of the recess 824, the vent opening 860a may have a different location along the length of the recess 824 than the vent opening 860b. Each hole 866a and 866b and each dielectric layer segment 882a and 882b may include any size, shape, and path. The size, shape, and/or path of the vent openings 860a and 860b, the number and/or pattern of vent openings 860a and 860b, and/or the like may be selected to provide the electronic device 810 with a predetermined volume for venting air, moisture, and/or other fluids from the recess 824 to the atmosphere 862.

The method 500 described above with reference to FIG. 9 may be used to fabricate the electronic device 810. For example, the holes 866a and 866b may be formed in a substantially similar fashion to the groove 66 (shown in FIGS. 3, 4, 10, and 12). An additional step (not shown) of forming the dielectric layer segments 882a and 882b of the vent openings 860a and 860b, respectively, may be included in the method 500. For example, the additional step of forming the dielectric layer segments 882a may be performed after the step 512 of forming the conductors 52 and 54 (shown in FIG. 2), whereas the holes 866a and 866b may be formed at the step 502 of the method 500. In some embodiments, forming the hole 866a and the dielectric layer segment 882a during the same drilling operation and/or forming the hole 866b and the dielectric layer segment 882b during the same drilling operation may lead to damage, fatigue, and/or the like to the electronic device 810.

Figure 19:
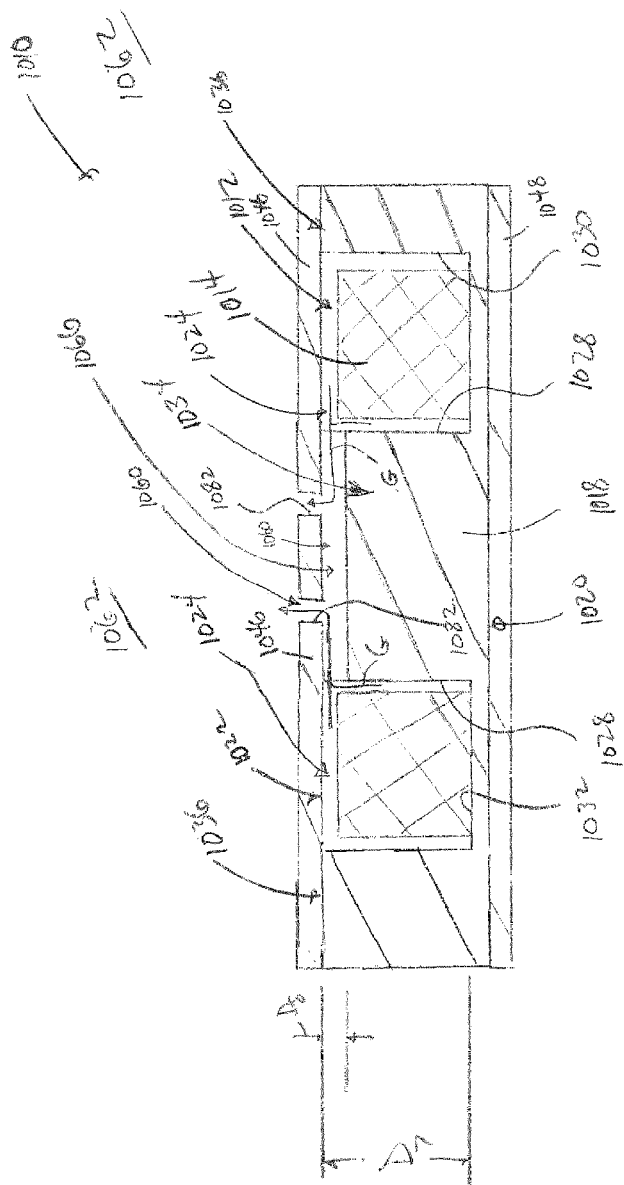
FIG. 19 is a cross-sectional view of another exemplary embodiment of a planar electronic device.
Figure 12:
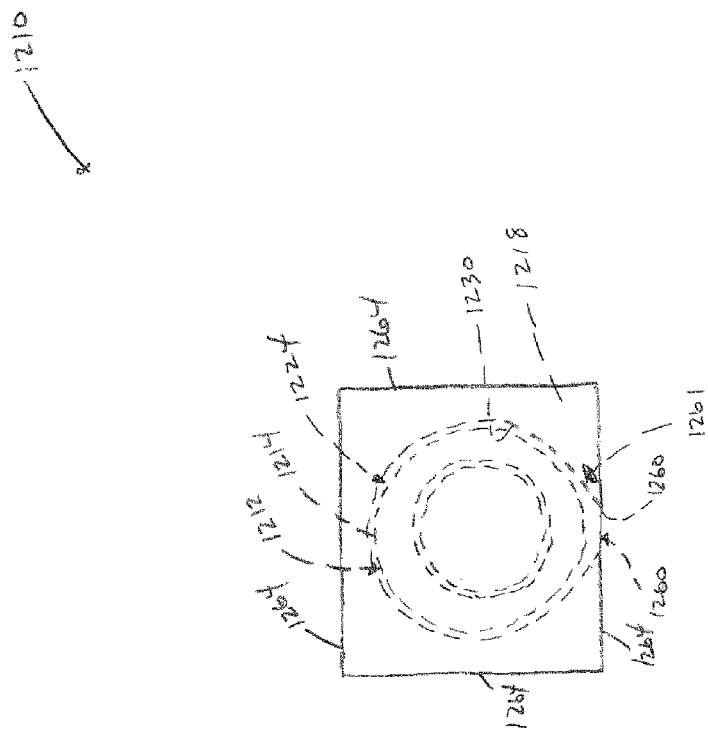

FIG. 19 is a cross-sectional view of another exemplary embodiment of a planar electronic device 1010. The planar electronic device 1010 includes a planar dielectric substrate 1018 and a magnetic component 1012, which includes a magnetic body 1014 and one or more conductive coils (not shown) that extend around the magnetic body 1014. The substrate 1018 extends a thickness from a lower side 1020 to an opposite upper side 1022. The substrate 1018 includes a recess 1024 within which the magnetic body 1014 is disposed. The recess 1024 divides the upper side 1022 of the substrate 1018 into an interior segment 1034 and a perimeter segment 1036. The recess 1024 of the substrate 1018 extends a depth $D_7$ to a bottom 1032. Opposing sidewalls 1028 and 1030 of the recess 1024 extend along the depth $D_7$ of the recess 1024. A dielectric layer 1046 is disposed above the upper side 1022 of the substrate 1018 and a dielectric layer 1048 is disposed below the lower side 1020 of the substrate 1018.

The electronic device 1010 includes a vent opening 1060 that extends within the substrate 1018. The vent opening 1060 includes a groove 1066 that extends into the upper side 1022 of the substrate 1018 along the interior segment 1034. The groove 1066 is a hollow conduit that extends through the sidewall 1028 at one or more locations such that the groove 1066 intersects the recess 1024. The hollow conduit of the groove 1066 is thereby fluidly connected to the recess 1024. Although shown as intersecting the recess 1024 at two locations, the groove 1066 may intersect the recess 1024 at any number of locations. A depth $D_8$ of the groove 1066 may have any value relative to the depth $D_7$ of the recess 1024. In some embodiment, the depth $D_8$ of the groove 1066 extends completely through the thickness of the substrate 1018.

In addition to the groove 1066, the vent opening 1060 includes one or more dielectric layer segments 1082 that extend through the dielectric layer 1046 of the electronic device 1010. The dielectric layer segments 1082 are at least partially aligned with the groove 1066 such that the dielectric layer segments 1082 are each fluidly connected to the groove 1066. The dielectric layer segments 1082 extend through the dielectric layer 1046 such that the dielectric layer segments 1082 of the vent opening 1060 are open to the atmosphere 1062 through the dielectric layer 1046. Accordingly, the groove 1066 and the dielectric layer segment 1082 of the vent opening 1060 fluidly connect the recess 1024 to the atmosphere 1062. The vent opening 1060 thereby provides a pathway for air, moisture, and/or other fluids to exhaust from the recess 1024 to the atmosphere 1062, as indicated by the arrows G in FIG. 19. The vent opening 1060 may include any number of the dielectric layer segments 1082, which may be arranged in any pattern.

The electronic device 1010 may include any number of the vent openings 1060. The groove 1066 and each dielectric layer segment 1082 may include any size, shape, and path. The size, shape, and/or path of the vent opening 1060, the number and/or pattern of vent openings 1060, and/or the like may be selected to provide the electronic device 1010 with a predetermined volume for venting air, moisture, and/or other fluids from the recess 1024 to the atmosphere 1062.

The method 500 described above with reference to FIG. 9 may be used to fabricate the electronic device 1010. For example, the groove 1066 may be formed in a substantially similar fashion to the groove 66 (shown in FIGS. 3, 4, and 10). An additional step (not shown) of forming the dielectric layer segments 1082 of the vent opening 1060 may be included in the method 500, for example after laminating the dielectric layer 1046 to the substrate 1018.

FIG. 20 is a top plan view of another exemplary embodiment of a planar electronic device 1110. The planar electronic device 1110 includes a planar dielectric substrate 1118 and a magnetic component 1112, which includes a magnetic body 1114 and one or more conductive coils (not shown) that extend around the magnetic body 1114. The conductive coil (s) of the planar electronic device 1110 are not shown in FIG. 20 for clarity. The substrate 1118 includes one or more sidewalls 1164 that extend along a thickness of the substrate 1118. The substrate 1118 includes a recess 1124 having opposing sidewalls 1128 and 1130 that extend along the thickness of the substrate 1118. The magnetic body 1114 is disposed within the recess 1124. A dielectric layer 1146 is disposed above the substrate 1118 and a dielectric layer (not shown) may be disposed below the substrate 1118.

The electronic device 1110 includes a vent opening 1160 that extends within the substrate 1118. The vent opening 1160 extends through the sidewall 1164 of the substrate 1118 and through the sidewall 1130 of the recess 1124 such that the recess 1124 is open to the atmosphere 1162. Specifically, in the exemplary embodiment of FIG. 20, the sidewall 1164 of the substrate 1118 intersects the sidewall 1130 of the recess 1124 to create the vent opening 1160. The vent opening 1160 fluidly connects the recess 1124 to the atmosphere 1162 to provide a pathway for air, moisture, and/or other fluids to exhaust from the recess 1124 to the atmosphere 1162.

The method 500 described above with reference to FIG. 9 may be used to fabricate the electronic device 1110. For example, a dicing line 80 (shown in FIG. 12) may be positioned to create the sidewall 1164 such that the sidewall 1164 intersects the recess 1124 and thereby creates the vent opening 1160. In other words, the dicing line 80 is selected to intersect the recess 1124 and thereby open the recess 1124 to the atmosphere 1162.

FIG. 21 is a top plan view of another exemplary embodiment of a planar electronic device 1210. The planar electronic device 1210 is similar to the planar electronic device 1110 (shown in FIG. 20), but the recess 1224 of the substrate 1218 of the electronic device 1210 includes a vent extension 1261 that is used to form a vent opening 1260 that extends through the substrate 1218 of the electronic device 1210. Specifically, in the exemplry embodiment of FIG. 21, the recess 1224 extends a length that is a closed curve having the general shape of a circle. The vent extension 1261 extends outward from the circle of the recess 1224. The vent opening 1260 extends through a sidewall 1264 of the substrate 1218 and through a sidewall 1230 of the recess 1224 such that the recess 1224 is open to the atmosphere 1262. Specifically, in the exemplary embodiment of FIG. 21, the sidewall 1264 of the substrate 1218 intersects the vent extension 1261, and thereby the sidewall 1230 of the recess 1224, to create the vent opening 1160. The vent opening 1260 fluidly connects the recess 1224 to the atmosphere 1262 to provide a pathway for air, moisture, and/or other fluids to exhaust from the recess 1224 to the atmosphere 1262. The vent extension 1261 may have any size and/or shape for a recess 1224 having any size and/or shape.

The method 500 described above with reference to FIG. 9 may be used to fabricate the electronic device 1210. For example, a dicing line 80 (shown in FIG. 12) may be positioned to create the sidewall 1264 such that the sidewall 1264 intersects the vent extension 1261 and thereby creates the vent opening 1260.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to one of ordinary skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable a person of ordinary skill in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A planar electronic device comprising:
a dielectric substrate having a recess;
a functional electrical component disposed at least partially within the recess such that a gap is created between the functional electrical component and the substrate;
a vent opening extending within the substrate such that the vent opening intersects the recess within a thickness of the substrate, wherein the vent opening is open to atmosphere such that the vent opening fluidly connects the gap of the recess to the atmosphere to provide a pathway for fluid to flow from the gap of the recess to the atmosphere;
wherein the functional electrical component comprises a magnetic component having a magnetic body that is disposed within the recess and conductive coils that extend around the magnetic body, the conductive coils comprising:
upper conductors disposed above the substrate;
lower conductors disposed below the substrate; and
electrical vias extending through the substrate and conductively coupled with the upper conductors and the lower conductors such that the electrical vias, the upper conductors, and the lower conductors form the conductive coils.

2. The device of claim 1, wherein the substrate extends the thickness from an upper side to a lower side that is opposite the upper side, the substrate comprising a sidewall that extends between the upper and lower sides, the vent opening extending through the sidewall.

3. The device of claim 1, further comprising a dielectric layer disposed above or below the substrate, the vent opening extending through the dielectric layer.

4. The device of claim 1, wherein the substrate extends the thickness from an upper side to a lower side that is opposite the upper side, the substrate comprising a sidewall that extends between the upper and lower sides, the vent opening comprising a groove that extends into the upper side of the substrate, the groove extending from the recess to the sidewall of the substrate, the groove extending through the sidewall such that the vent opening is open to the atmosphere through the sidewall.

5. The device of claim 1, further comprising a dielectric layer disposed above or below the substrate, wherein the substrate extends the thickness from an upper side to a lower side that is opposite the upper side, the substrate comprising a sidewall that extends between the upper and lower sides, the vent opening comprising a groove that extends into the upper side of the substrate, the vent opening comprising a dielectric layer segment that extends through the dielectric layer such that the vent opening is open to the atmosphere through the dielectric layer.

6. The device of claim 1, wherein the substrate extends the thickness from an upper side to a lower side that is opposite the upper side, the substrate comprising a sidewall that extends between the upper and lower sides, the vent opening comprising a hole that extends through at least a portion of the thickness of the substrate, the hole intersecting both the recess and the sidewall of the substrate to provide the fluid connection between the recess and the atmosphere.

7. The device of claim 1, further comprising a dielectric layer disposed above or below the substrate, the vent opening comprising a hole that extends through at least a portion of the thickness of the substrate and intersects the recess, the vent opening comprising a dielectric layer segment that extends through the dielectric layer such that the vent opening is open to the atmosphere through the dielectric layer.

8. The device of claim 1, wherein the recess divides the substrate into an interior segment and a perimeter segment, the device further comprising a dielectric layer disposed above or below the substrate, the vent opening comprising a hole that extends through at least a portion of the thickness of the substrate and intersects the recess, the vent opening comprising a dielectric layer segment that extends through the dielectric layer such that the vent opening is open to the atmosphere through the dielectric layer, wherein the hole extends through the interior segment of the substrate.

9. The device of claim 1, further comprising a dielectric layer disposed above or below the substrate, wherein the substrate extends the thickness from an upper side to a lower side that is opposite the upper side, the vent opening comprising a groove that extends into the upper side of the substrate and intersects the recess, the vent opening comprising a dielectric layer segment that extends through the dielectric layer such that the vent opening is open to the atmosphere through the dielectric layer.

10. The device of claim 1, further comprising an upper dielectric layer disposed above the substrate and a lower dielectric layer disposed below the substrate, the vent opening extending through both the upper dielectric layer and the lower dielectric layer.

11. The device of claim 1, wherein the vent opening extends completely through the thickness of the substrate or includes a bottom that is aligned with a bottom of the recess.

12. The device of claim 1, wherein the recess comprises a sidewall, the gap extending between the functional electrical component and the sidewall.

13. The device of claim 1, further comprising an upper dielectric layer disposed above the substrate and a lower dielectric layer disposed below the substrate, wherein the upper conductors are provided on the upper dielectric layer and the lower conductors are provided on the lower dielectric layer.

* * * * *